US012701957B2

(12) United States Patent
Lee et al.

(10) Patent No.: US 12,701,957 B2
(45) Date of Patent: Aug. 4, 2026

(54) TRAY

(71) Applicant: Samsung Display Co., LTD., Yongin-si (KR)

(72) Inventors: Kyung Jo Lee, Yongin-si (KR); Eui Young Kim, Yongin-si (KR); Hong Ju Kim, Yongin-si (KR); Hyun Gyu Lee, Yongin-si (KR); Nam Pyo Hong, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 18/945,886

(22) Filed: Nov. 13, 2024

(65) Prior Publication Data

US 2025/0323075 A1 Oct. 16, 2025

(30) Foreign Application Priority Data

Apr. 11, 2024 (KR) ........................ 10-2024-0048484

(51) Int. Cl.
H10P 72/10 (2026.01)
B65D 1/36 (2006.01)
B65D 81/05 (2006.01)

(52) U.S. Cl.
CPC ................ H10P 72/17 (2026.01); B65D 1/36 (2013.01); B65D 81/054 (2013.01)

(58) Field of Classification Search
CPC ..... H01L 21/6734; B65D 1/36; B65D 81/054; B65D 2585/6837; B65D 85/48; B65D 81/053; B65D 81/022; B65D 1/42
USPC ....................................................... 206/725
See application file for complete search history.

(56) References Cited

U.S. PATENT DOCUMENTS

| | | | |
|---|---|---|---|
| 10,065,783 B2 | 9/2018 | Zhao et al. | |
| 11,247,830 B2 * | 2/2022 | Uchida | B65D 81/05 |
| 2013/0306514 A1 * | 11/2013 | Hu | B65D 81/053 |
| | | | 206/586 |
| 2014/0262927 A1 * | 9/2014 | Guo | B65D 81/056 |
| | | | 206/706 |
| 2020/0277122 A1 * | 9/2020 | Uchida | B65D 85/48 |
| 2023/0322463 A1 | 10/2023 | Kang et al. | |
| 2025/0353656 A1 * | 11/2025 | Hammerschmidt | B65D 81/053 |

FOREIGN PATENT DOCUMENTS

| | | |
|---|---|---|
| KR | 10-1979903 | 5/2019 |
| KR | 10-2023-0111628 | 7/2023 |

* cited by examiner

*Primary Examiner* — Orlando E Aviles
*Assistant Examiner* — Sanjidul Islam
(74) *Attorney, Agent, or Firm* — Sughrue Mion, PLLC

(57) ABSTRACT

Provided is a tray including a tray bottom part including a loading target resting surface that includes at least one corner in plan view, a sidewall part protruding from of the tray bottom part in a thickness direction and surrounding the loading target resting surface at least partially, and a corner buffer member disposed on an inner surface of the sidewall part adjacent to the at least one corner portion of the loading target resting surface, wherein the corner buffer member includes a first area which faces and is supported by the sidewall part in a first horizontal direction, and a second area which extends from the first area in a second horizontal direction intersecting the first horizontal direction and is not supported by the sidewall part in the first horizontal direction.

20 Claims, 25 Drawing Sheets

TRAY

CROSS-REFERENCE TO RELATED APPLICATION

This application claims priority to and benefits of Korean Patent Application No. 10-2024-0048484 under 35 U.S.C. § 119, filed on Apr. 11, 2024 in the Korean Intellectual Property Office, the entire disclosure of which are incorporated herein by reference.

BACKGROUND

1. Technical Field

The disclosure generally relates to a tray. More particularly, the disclosure relates to a tray capable of reducing impact forces during or after a fall or collision.

2. Description of the Related Art

As the information society progresses, demand for display devices to display images is increasing in various forms. For example, display devices are being applied to a variety of electronic devices such as smartphones, digital cameras, laptop computers, navigation systems, and smart televisions.

There are several types of display devices in use, such as organic light-emitting diode (OLED) displays and liquid crystal displays (LCDs). OLED displays utilize organic light-emitting elements that emit light through the recombination of electrons and holes. These OLED displays include multiple transistors that provide driving current to the organic light-emitting elements.

Particularly, display panels such as organic light-emitting display panels increasingly become smaller and thinner. Therefore, it's imperative to avoid flaws when loading/unloading and transporting display devices that use these kinds of display panels.

Generally, display devices can be loaded, transported, and stored in trays during several manufacturing processes, and trays prepared for loading display devices in their final product state are used for packaging and transport.

Furthermore, one display device can be loaded and transported per tray, but for an improved process and loading efficiency, there is a need to load, transport, and store multiple display devices at once, which may involve stacking multiple trays for loading, storage, and transport.

In such trays, guides are provided to support and protect the display devices housed within in case that external forces such as shocks and vibrations are applied, or during shipping and transport. These guides prevent movement of the display device, ensuring stability against impacts and vibrations during transit. However, since these guides are made of a very hard material identical to the material of the trays, impacts (or external forces) can readily harm the display devices, particularly making the edge areas of the display devices susceptible to impacts and external forces.

SUMMARY

Aspects of the disclosure provide a tray that can reduce impact forces by extending the duration of collision through the compression and deformation of its corner buffer members during or after a fall or collision.

According to an embodiment of the disclosure, a tray comprising: a tray bottom part including a loading target resting surface that includes at least one corner portion in plan view; a sidewall part protruding from the tray bottom part in a thickness direction and surrounding the loading target resting surface at least partially; and a corner buffer member disposed on an inner surface of the sidewall part adjacent to the at least one corner portion of the loading target resting surface, wherein the corner buffer member includes a first area which faces and is supported by the sidewall part in a first horizontal direction, and a second area which extends from the first area in a second horizontal direction intersecting the first horizontal direction and is not supported by the sidewall part in the first horizontal direction.

In an embodiment, the first area contacts the inner surface of the sidewall part, and the second area extends from the first area to an end portion in a horizontal direction intersecting the first horizontal direction.

In an embodiment, an inner surface of the sidewall part supporting the corner buffer member extends in the second horizontal direction that intersects the first horizontal direction, and the second area of the corner buffer member is spaced apart from a portion of the sidewall part that extends in the second horizontal direction.

In an embodiment, the tray bottom part includes a base surface, the base surface and the loading target resting surface disposed in a same plane, and a coupling groove which is recessed from the base surface in the thickness direction, and the corner buffer member is inserted in the coupling groove.

In an embodiment, the coupling groove includes a coupling part, which overlaps the corner buffer member in the thickness direction, and an escape part, which is recessed toward the first horizontal direction from the coupling part overlapping the second area of the corner buffer member.

In an embodiment, in an unbent state of the corner buffer member, the escape part does not overlap the corner buffer member.

In an embodiment, in a bent state of the corner buffer member, at least part of the second area of the corner buffer member is positioned in the escape part.

In an embodiment, the corner buffer member includes a first extension part, which extends in the second horizontal direction intersecting the first horizontal direction, and a second extension part, which extends in the first horizontal direction.

In an embodiment, the second area is provided on the second extension part.

In an embodiment, the corner buffer member further includes a bending groove, which is recessed on an inside of an intersection between the first and second extension parts.

In an embodiment, the bending groove faces the at least one corner portion of the loading target resting surface.

In an embodiment, further comprising: a storage compartment formed by the tray bottom part and the sidewall part and accommodating a loading target to overlap the loading target resting surface, wherein the corner buffer member is positioned at an edge area of the loading target accommodated in the storage compartment.

In an embodiment, the coupling part further includes a coupling protrusion which protrudes in the thickness direction, and the corner buffer member further includes a protrusion insertion hole into which the coupling protrusion is inserted.

In an embodiment, the corner buffer member further includes at least one bending slit which is formed as a cut line extending either in the first horizontal direction or in the second horizontal direction.

In an embodiment, the corner buffer member further includes multiple perforations.

In an embodiment, the loading target has a rectangular shape including a pair of long sides positioned in the second horizontal direction and a pair of short sides positioned in the first horizontal direction, and the tray further includes an auxiliary buffer member positioned in the sidewall part and facing at least one of the pair of long sides.

In an embodiment, the loading target further includes a circuit member, which is provided on at least one of the pair of long sides, and the auxiliary buffer member faces the circuit member and is arranged in the second horizontal direction.

In an embodiment, the circuit member includes a protruding area, a part of which is positioned to protrude outward from the loading target in the second horizontal direction, and the corner buffer member is disposed to face the protruding area of the circuit member at a location apart from the protruding area of the circuit member in the first horizontal direction.

In an embodiment, the auxiliary buffer member includes a buffer part which protrudes in the first horizontal direction toward the loading target from the sidewall part to face the loading target, and a buffer support part which is disposed in the second horizontal direction intersecting the buffer part and is fixed to the sidewall part.

In an embodiment, the sidewall part includes a receiving groove which is positioned in the second horizontal direction and accommodates the buffer support part.

According to the aforementioned and other embodiments, in response to the occurrence of an external force, such as vibration, or during a fall or collision, the compression and deformation of corner buffer members can increase the duration of collision. This can reduce the impact force, thereby protecting loaded components from damage and preventing breakage. In particular, it is possible to protect and prevent damage to the edge areas of the loaded components, which are vulnerable to impacts and external forces.

It should be noted that the effects of the disclosure are not limited to those described above, and other effects of the disclosure will be apparent from the following description.

BRIEF DESCRIPTION OF THE DRAWINGS

The above and other aspects and features of the disclosure will become more apparent by describing in detail embodiments thereof with reference to the attached drawings, in which:

FIG. 2 is a schematic assembled perspective view of the tray of FIG. 1;

FIG. 13 presents an enlarged schematic top view of the area where the auxiliary buffer members of FIG. 5 are installed, before the occurrence of an external force on a loading target;

DETAILED DESCRIPTION OF THE EMBODIMENTS

Figure 1:
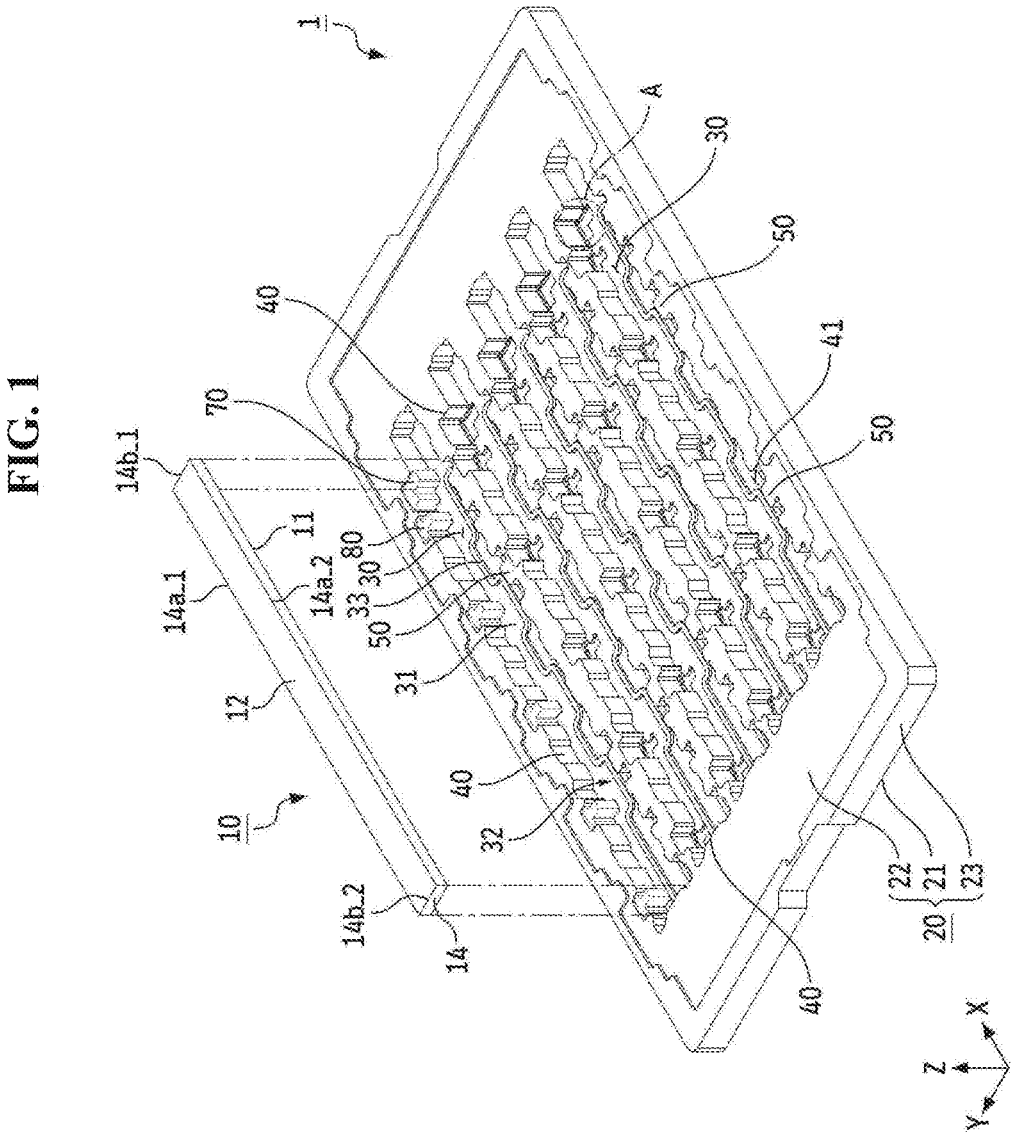
FIG. 1 is a schematic exploded perspective view illustrating a tray and a loading target according to an embodiment.

In the following description, for the purposes of explanation, numerous specific details are set forth in order to provide a thorough understanding of various embodiments or implementations of the invention. As used herein "embodiments" and "implementations" are interchangeable words that are non-limiting examples of devices or methods disclosed herein. It is apparent, however, that various embodiments may be practiced without these specific details or with one or more equivalent arrangements. Here, various embodiments do not have to be exclusive nor limit the disclosure. For example, specific shapes, configurations, and characteristics of an embodiment may be used or implemented in another embodiment.

Unless otherwise specified, the illustrated embodiments are to be understood as providing features of the invention. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. In case that an embodiment may be implemented differently, a specific process order may be performed differently from the described order. For example, two consecutively described processes may be performed substantially at the same time or performed in an order opposite to the described order. Also, like reference numerals and/or reference characters denote like elements.

In case that an element, such as a layer, is referred to as being "on," "connected to," or "coupled to" another element or layer, it may be directly on, connected to, or coupled to the other element or layer or intervening elements or layers may be present. In case that, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the X-axis, the Y-axis, and the Z-axis are not limited to three axes of a rectangular coordinate system, such as the x, y, and z axes, and may be interpreted in a broader sense. For example, the X-axis, the Y-axis, and the Z-axis may be perpendicular to one another, or may represent different directions that are not perpendicular to one another. For the purposes of this disclosure, "at least one of A and B" may be construed as A only, B only, or any combination of A and B. Also, "at least one of X, Y, and Z" and "at least one selected from the group consisting of X, Y, and Z" may be construed as X only, Y only, Z only, or any combination of two or more of X, Y, and Z. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," in case that used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various embodiments are described herein with reference to sectional and/or exploded illustrations that are schematic illustrations of embodiments and/or intermediate structures. As such, variations from the shapes of the illustrations as a result, for example, of manufacturing techniques and/or tolerances, are to be expected. Thus, embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

As customary in the field, some embodiments are described and illustrated in the accompanying drawings in terms of functional blocks, units, and/or modules. Those skilled in the art will appreciate that these blocks, units, and/or modules are physically implemented by electronic (or optical) circuits, such as logic circuits, discrete components, microprocessors, hard-wired circuits, memory elements, wiring connections, and the like, which may be formed using semiconductor-based fabrication techniques or other manufacturing technologies. In the case of the blocks, units, and/or modules being implemented by microprocessors or other similar hardware, they may be programmed and controlled using software (e.g., microcode) to perform various functions discussed herein and may optionally be driven by firmware and/or software. It is also contemplated that each block, unit, and/or module may be implemented by dedicated hardware, or as a combination of dedicated hardware to perform some functions and a processor (e.g., one or more programmed microprocessors and associated circuitry) to perform other functions. Also, each block, unit, and/or module of some embodiments may be physically separated into two or more interacting and discrete blocks, units, and/or modules without departing from the scope of the inventive concepts. Further, the blocks, units, and/or modules of some embodiments may be physically combined into more complex blocks, units, and/or modules without departing from the scope of the inventive concepts.

Figure 2:
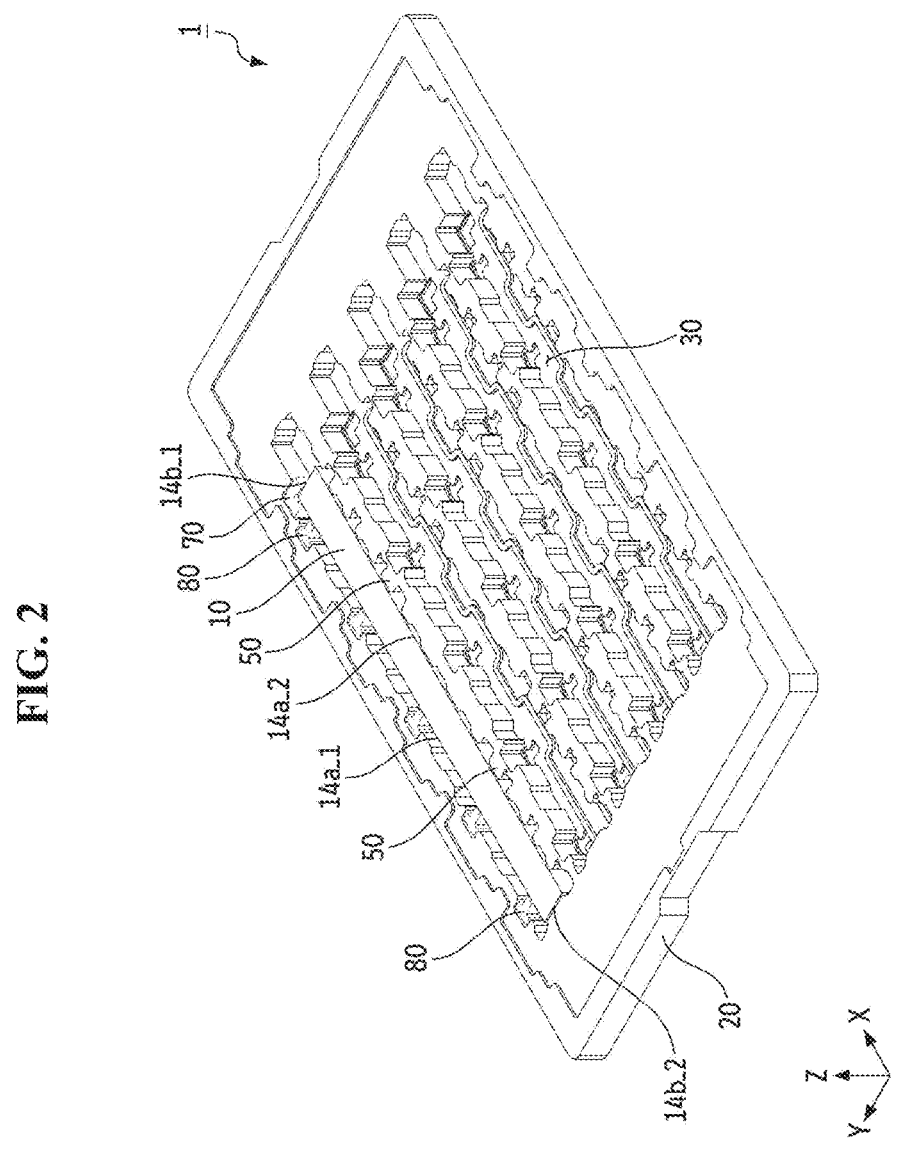
Figure 3:
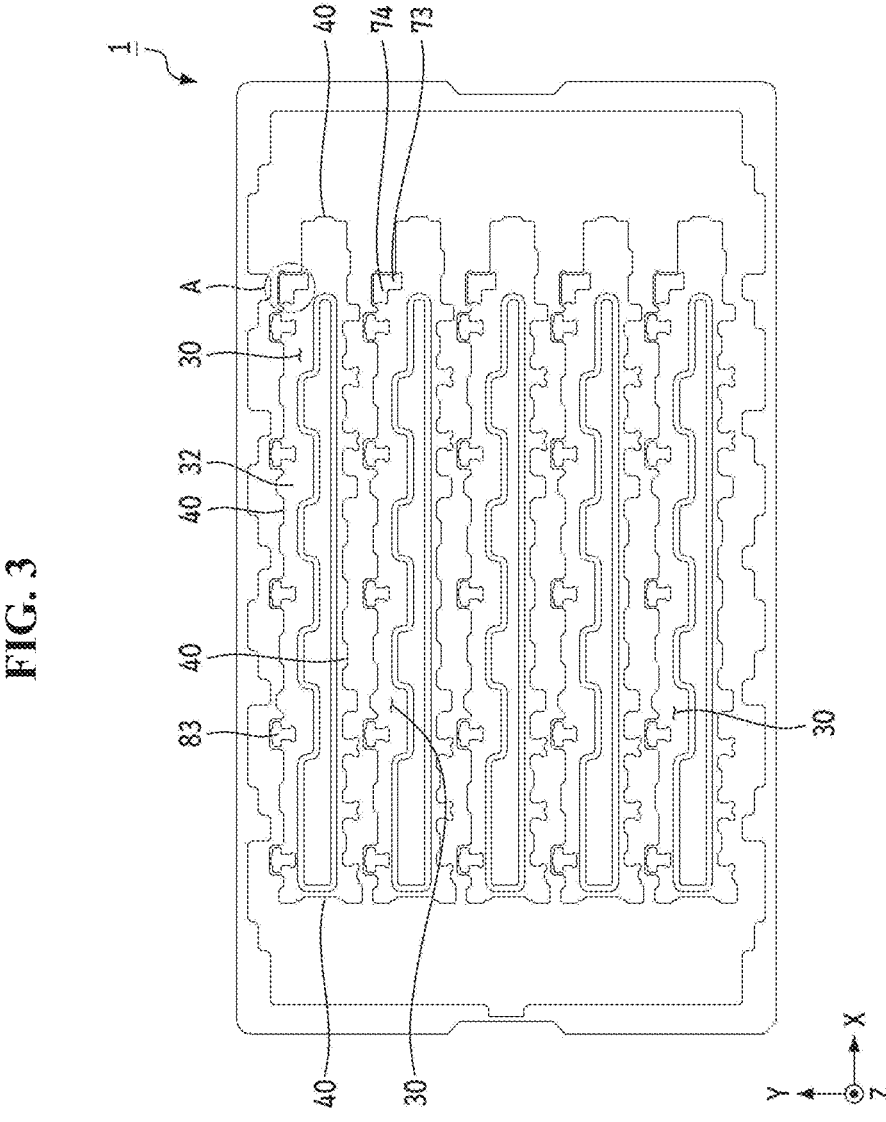
FIG. 3 is a schematic top view of the tray of FIG. 1.
Figure 4:
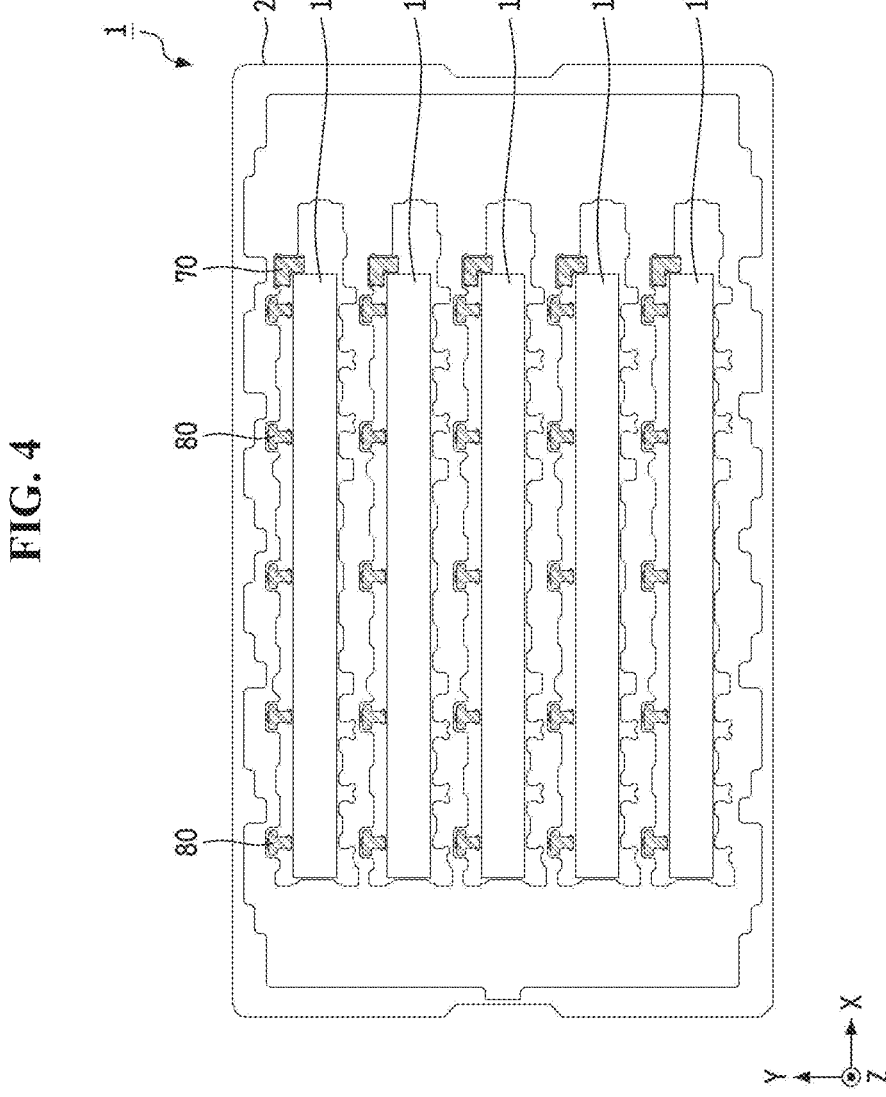
FIG. 4 is a schematic assembled top view of the tray of FIG. 1 with multiple loading targets loaded in respective storage compartments of FIG. 1.

FIG. 1 is a schematic exploded perspective view illustrating a tray and a loading target according to an embodiment, FIG. 2 is a schematic assembled perspective view of the tray of FIG. 1, FIG. 3 is a schematic top view of the tray of FIG. 1, and FIG. 4 is a schematic assembled top view of the tray of FIG. 1 with multiple loading targets loaded in respective storage compartment of FIG. 1.

For example, FIG. 1 is a schematic exploded perspective view of a tray and a loading target according to an embodiment, FIG. 2 is a schematic assembled perspective view of the tray and the loading target of FIG. 1, and FIG. 3 is a schematic top view illustrating the tray of FIG. 2 with multiple loading targets accommodated therein.

Referring to FIGS. 1 and 2, a tray 1 may store and protect loading targets 10, which are target components for loading. Specifically, the tray 1 may protect the loading targets 10 from the external environment by accommodating the loading targets 10 in its internal space. The tray 1 may prevent damage caused by the movement of the loading targets 10 stored therein during the transport of the loading targets 10.

The tray 1 may be formed of various materials that can provide the strength to protect the loading targets 10 from an external force or environmental changes during storage or transport. Considering manufacturing convenience and costs, the tray 1 may include an injectable polymer.

The injectable polymer may include at least one selected from among polypropylene (PP), polyethylene terephthalate (PET), polyvinyl chloride (PVC), an acrylonitrile butadiene styrene (ABS) copolymer, and polystyrene (PS). Preferably, the tray 1 may be formed of an ABS resin or PS resin, but the disclosure is not limited thereto.

The loading targets 10 may be loaded and stored, or may be transported while accommodated in the tray 1. The loading targets 10 may be various display devices providing display screens such as smartphones, smartwatches, tablet PCs, laptops, televisions, and automotive display modules, but the disclosure is not limited thereto.

For display devices, which are examples of the loading targets 10, various thin films are formed on a substrate and are then modularized. Not only intermediate display devices before modularization, but also completed display substrates after modularization may be loaded, transported, and stored in the tray 1.

As for display devices, which are examples of the loading targets 10, upper surfaces 11, which includes display units where screens are displayed, may be accommodated in storage compartments 30 of the tray 1 that will be described later, and lower surfaces 12, which correspond to the backsides of the display devices, may be exposed to the outside of the tray 1. However, the disclosure is not limited thereto. In another example, the lower surfaces 12 may also be accommodated in the storage compartments 30. Flexible printed circuit boards (FPCBs) 111 which may be bent may also be positioned on the lower surfaces 12 of the loading targets 10, but the disclosure is not limited thereto.

The loading targets 10 may be, for example, display devices, and each of the display devices may include a display panel.

The display panel may include one or more light sources that provide light. For example, the display panel may be a light-receiving panel that includes an external light source, or a self-emitting panel that includes internal light-emitting elements. The self-emitting panel includes multiple light-emitting elements. Examples of the light-emitting elements include organic light-emitting diodes (OLEDs), quantum dot light-emitting diodes (LEDs), inorganic-based micro-LEDs, and inorganic-based nano-LEDs.

Each of the loading targets 10 may have an upper surface 11 that is accommodated within the tray 1, a lower surface 12 that is opposite to the upper surface 11, and four side surfaces (or four circumferential surfaces) 14 that are positioned along the circumferential direction of the corresponding loading target 10 between the upper surface 11 and the lower surface 12.

The side surfaces (or circumferential surfaces) 14 may include a pair of long side surfaces 14a_1 and 14_2, which extend along an X-axis direction and face auxiliary buffer members 80 and guides 50, and a pair of short side surfaces 14b_1 and 14b_2, which extend along a Y-axis direction.

The long side surfaces (or long circumferential surfaces) 14a_1 and 14a_2 may include a first long side surface (or first long circumferential surface) 14a_1, which faces the auxiliary buffer members 80, and a second long side surface (or second long circumferential surface) 14a_2, which face the guides 50.

The short side surfaces 14b_1 and 14b_2 may include a first short side surface 14b_1, which faces corner buffer members 70, and a second short side surface 14b_2, which is opposite to the first short side surface 14b_1.

For example, in case that the loading targets 10 are automotive display modules, the loading targets 10 may be in the form of bar-shaped rectangular modules with long sides in the X-axis direction, as illustrated in FIG. 1, but the disclosure is not limited thereto. For example, the loading targets 10 may have various other shapes such as a triangular, rectangular, pentagonal, hexagonal, circular, or oval shape. In case that the loading targets 10 are display devices, various shapes of display devices such as curved, bent, and flat display devices and various sizes of display devices may be loaded in the tray 1.

Referring to FIG. 2, multiple loading targets 10 may be accommodated in one tray 1. For example, referring to FIG. 4, five loading targets 10 may be accommodated in one tray 1, but the disclosure is not limited thereto. In another example, a single tray 1 may accommodate only one loading target 10.

Referring to FIGS. 1 through 3, the tray 1 may include a tray body 20 that forms the exterior of the tray 1, and the tray body 20 may include the storage compartments 30 that accommodate the loading targets 10.

The exterior of the tray body 20 may have a cuboid shape, and tray body 20 may have a rectangular shape in a plan view. However, the disclosure is not limited to this. For example, the exterior of the tray 1 may have various other shapes such as a polyhedral shape, and the upper plane of the tray 1 may be square, polygonal, or circular.

The tray body 20 of FIG. 1 may have a tray lower surface 21, which is positioned on the installation surface of the tray 1, a tray upper surface 22, which is opposite to the tray lower surface 21 with respect to a Z-axis direction, and four tray side surfaces (or four tray circumferential surfaces) 23, which are positioned along the circumferential direction of the tray 1 disposed between the tray lower surface 21 and the tray upper surface 22. The tray 1 is illustrated in FIG. 1 as being a rectangular cuboid with four tray side surfaces (or four tray circumferential surfaces) 23, but the disclosure is not limited thereto. For example, the number of tray side surfaces (or tray circumferential surfaces) 23 may vary as one, two, four, or five depending on the overall shape of the tray 1.

The thickness, in the Z-axis direction, of the tray body 20 (e.g., the thickness from the tray lower surface 21 to the tray upper surface 22) may be greater than the thickness of the loading targets 10.

Referring to FIG. 2, multiple storage compartments 30 may be provided in the tray body 20 and may extend along the Y-axis direction to accommodate multiple loading targets 10, but the disclosure is not limited thereto. In another example, a single tray body 20 may be provided with only one storage compartment 30.

Referring to FIGS. 1 and 3, each of the storage compartments 30 may include a tray bottom part 32, which includes a loading target resting surface 31 that includes at least one corner A in plan view, and a tray sidewall part 40, which protrudes from a portion of the tray bottom part 32 along the Z-axis direction (e.g., a thickness direction). The tray sidewall part 40 may at least partially surround the loading target resting surface 31.

Each of the storage compartments 30 may be a space defined by the tray bottom part 32 which overlaps a loading target 10, and the tray sidewall part 40 which protrudes upward from the tray bottom part 32 in the Z-axis direction.

The storage compartments 30, as defined by their tray bottom part 32 and tray sidewall part 40, may have a size corresponding to the size of the loading targets 10 to be able to accommodate the loading targets 10. For example, the size of the storage compartments 30 may be larger than the size of the loading targets 10 to allow some gap between the loading targets 10 and the tray sidewall parts 40 of the storage compartments 30, or the storage compartments 30 may be the same size as the loading targets 10. However, the disclosure is not limited to this example. The size of the storage compartments 30 is not particularly limited as long as it allows the insertion and removal of the loading targets 10.

The storage compartments 30 may have a shape identical or similar to the shape of the loading targets 10. For example, in case that the loading targets 10 have various shapes such as triangular, rectangular, pentagonal, hexagonal, circular, or oval, the storage compartment 30 may have the same shape as the loading targets 10. However, the disclosure is not limited to this example. For example, in case that the loading targets 10 accommodated in the storage compartments 30 are automotive modules having an elongated rectangular module shape as illustrated in FIG. 1, the storage compartments 30 may have a similar elongated rectangular groove shape, but the disclosure is not limited thereto.

In case that the loading targets 10 are accommodated in the storage compartments 30, the upper surfaces 11 of the loading targets 10 may face the loading target resting surfaces 31 of the tray bottom parts 32 of the storage compartments 30, and the side surfaces (or circumferential surfaces) 14 of the loading targets 10 may contact or be spaced from the guides 50, the auxiliary buffer members 80, and the corner buffer members 70. For example, there may exist some gap.

The tray bottom parts 32 of the storage compartments 30 may include loading target resting surfaces 31 on which the loading targets 10 rest. The tray bottom parts 32 may overlap the loading targets 10 accommodated within the storage compartments 30. Consequently, in case that the loading targets 10 are seated on the tray bottom parts 32 and accommodated within the storage compartments 30, the loading target resting surfaces 31 may face the upper surfaces 11 of the loading targets 10.

The tray bottom parts 32 of the storage compartments 30 may be positioned in a stepwise fashion from the tray upper surface 22 toward the tray lower surface 21 of the tray body 20 along the Z-axis direction (e.g., thickness direction).

The tray bottom parts 32 of the storage compartments 30 may have a rectangular shape in plan view, but the disclosure is not limited thereto. The tray bottom parts 32, like the loading targets 10, may have various other shapes such as a square, circular, or oval shape, but the disclosure is not limited thereto.

The tray bottom parts 32 of the storage compartments 30 may further include stoppers 33 which provide a support from below the lower surfaces of the loading targets 10 accommodated within the storage compartments 30.

The stoppers 33 may be positioned in the tray bottom parts 32 to minimize vertical movement of the loading targets 10 and prevent damage to the loading targets 10. The stoppers 33 may be formed along the edge areas of the tray bottom parts 32, thus enhancing the lower strength of the tray 1. Particularly, the stoppers 33 can prevent the exterior of the tray 1 from being changed due to storage and transport conditions. For example, the stoppers 33 can prevent bending or twisting of the tray 1.

The stoppers 33 may be formed along the circumferential direction of the tray 1 in the tray bottom parts 32 and may be formed in various shapes such as a polygonal or oval shape, but the disclosure is not limited thereto.

Figure 5:
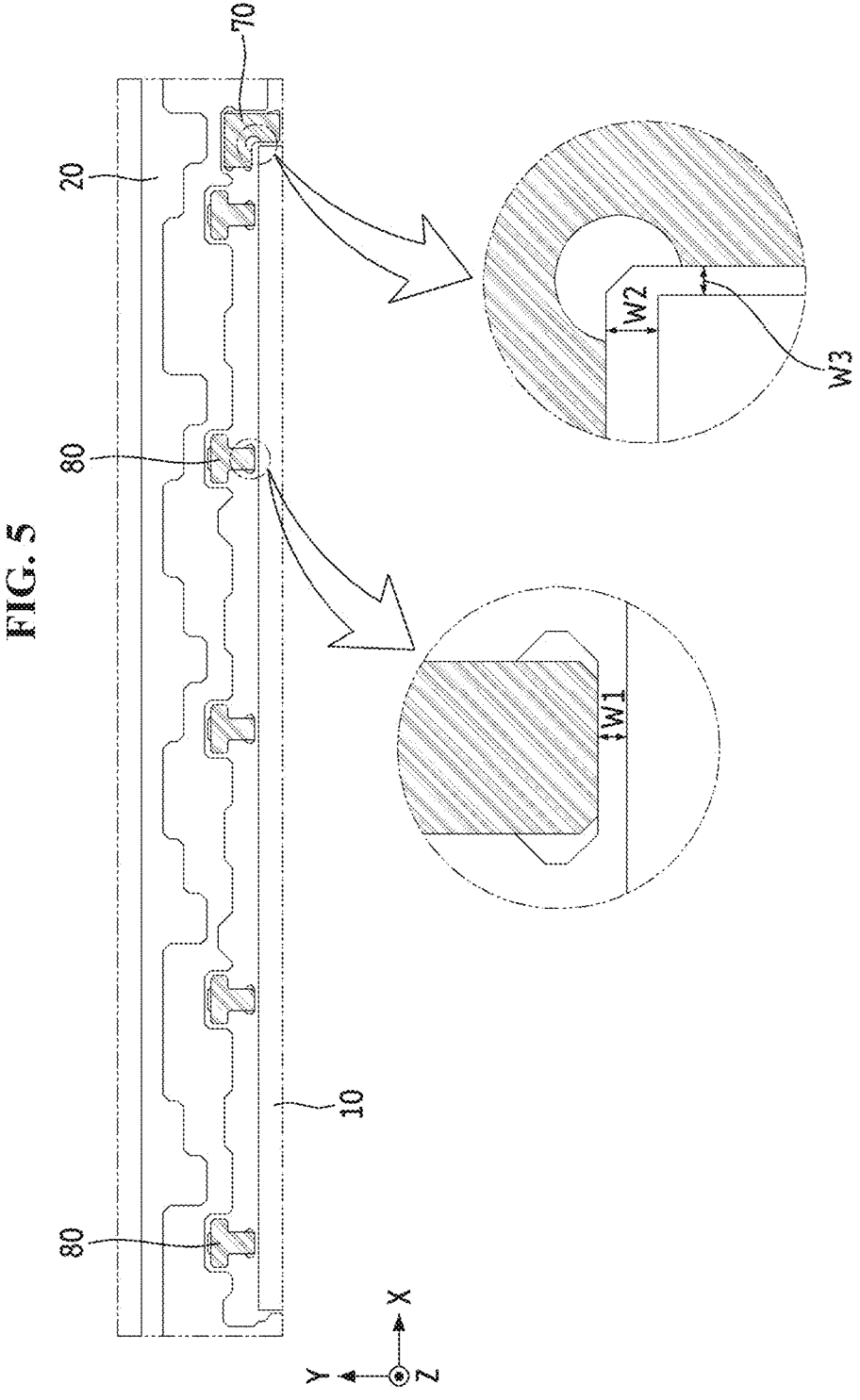
FIG. 5 presents enlarged schematic top views illustrating the assembled state of auxiliary buffer members and corner buffer members of FIG. 2.
Figure 6:
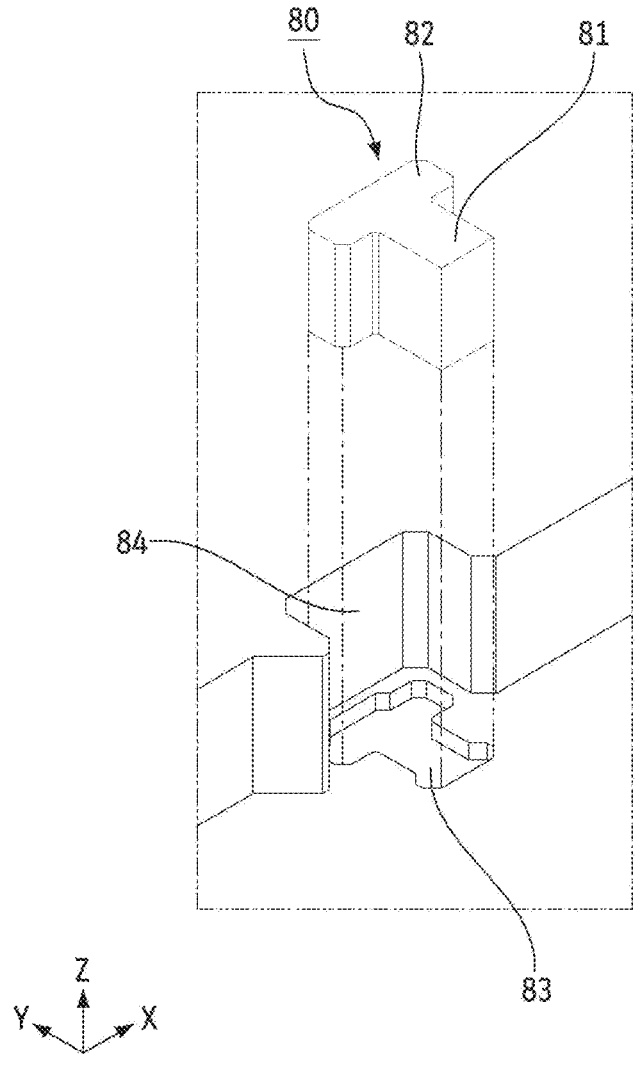
FIG. 6 is an enlarged schematic perspective view of an auxiliary buffer member of FIG. 5.
Figure 7:
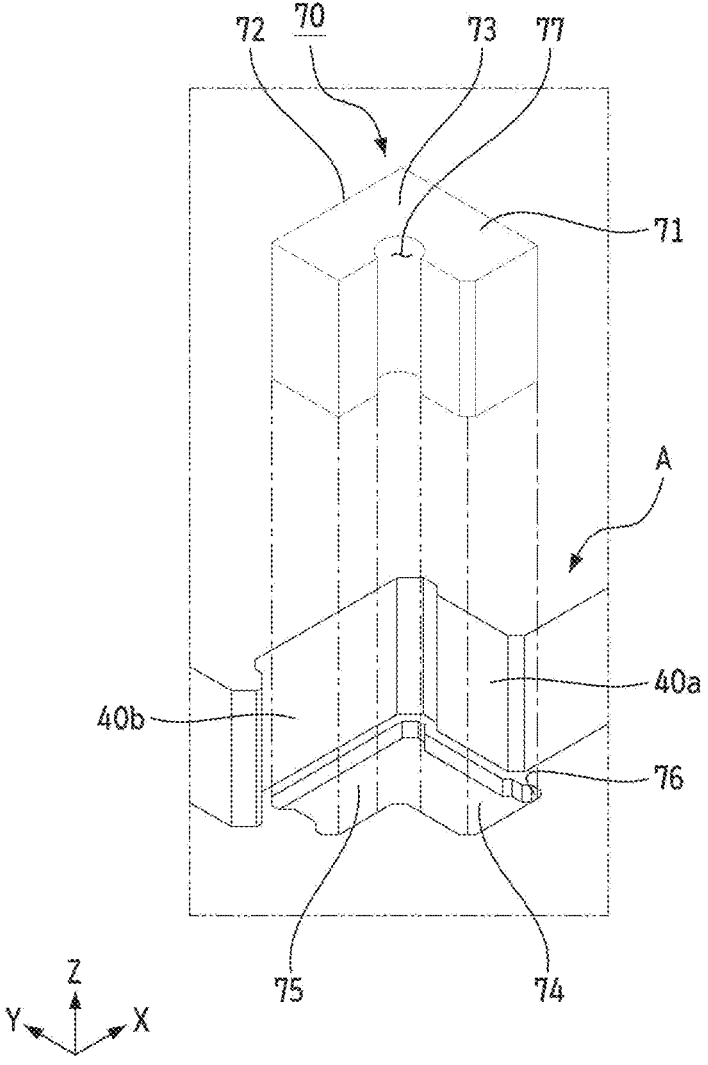
FIG. 7 is an enlarged schematic perspective view of a corner buffer member of FIG. 5.
Figure 8:
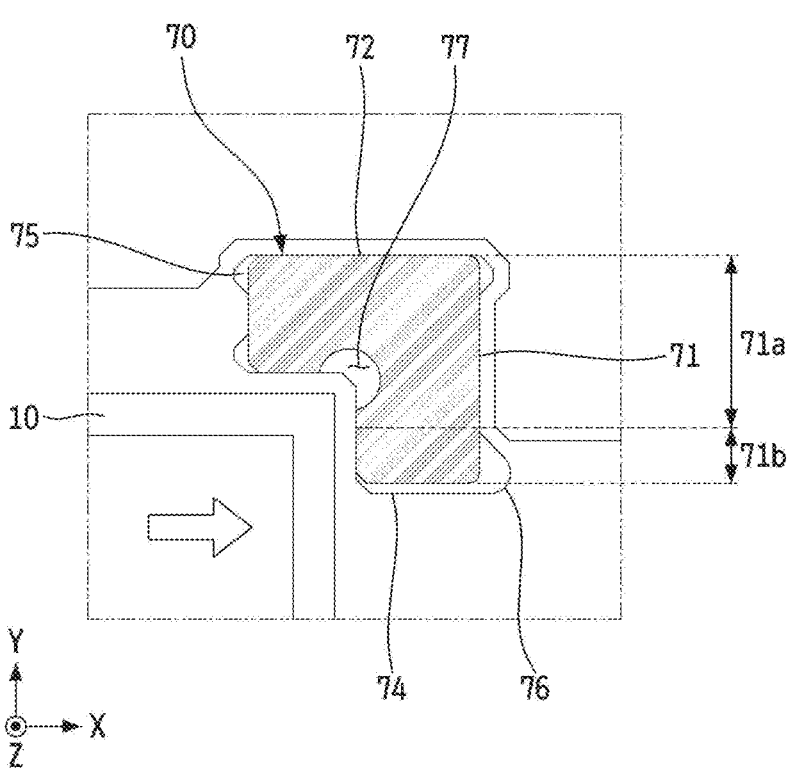
FIG. 8 is an enlarged schematic top view of the area where the corner buffer member of FIG. 7 is installed on a loading target prior to the application of an external force.

FIG. 5 presents enlarged schematic top views illustrating the assembled state of auxiliary buffer members and corner buffer members of FIG. 2, FIG. 6 is an enlarged schematic perspective view of an auxiliary buffer member of FIG. 5, FIG. 7 is an enlarged schematic perspective view of a corner buffer member of FIG. 5, and FIG. 8 is an enlarged schematic top view of the area where the corner buffer member of FIG. 7 is installed on a loading target prior to the application of an external force.

Referring to FIGS. 1, 4, and 5, the tray sidewall parts 40 of the storage compartments 30 may include insertion/removal guide grooves 41, which guide the insertion and removal of the loading targets 10 within the storage compartments 30, guides 50, which protrude toward the loading targets 10, and corner buffer members 70 and auxiliary buffer members 80, which protect the loading targets 10.

The tray sidewall parts 40 may be positioned in the Z-axis direction, which is an upright direction relative to the tray bottom parts 32, and may be disposed along the circumferential direction of the tray bottom parts 32 to face the side surfaces (or circumferential surfaces) 14 of the loading targets 10 accommodated in the storage compartments 30. The tray sidewall parts 40 may be defined by the guides 50, the auxiliary buffer members 80, and the corner buffer members 70, which are positioned along the circumferences of the storage compartments 30.

The tray sidewall parts 40 may protrude in the Z-axis direction, which is the thickness direction of the tray body 20, from parts of the tray bottom parts 32, and may partially surround the loading target resting surfaces 31. Specifically, the tray sidewall parts 40 are erected upward from the tray bottom parts 32 toward the tray upper surface 22 along the Z-axis direction, which is the thickness direction of the tray body 20, and may be disposed along the edge areas of the tray bottom parts 32.

The height of the tray sidewall parts 40 in the Z-axis direction may be equal to or greater than the height of the guides 50, the auxiliary buffer members 80, and the corner buffer members 70.

The insertion/removal guide grooves 41 may be positioned on the tray sidewall parts 40 and may allow the loading targets 10 to be removed from the storage compartments 30. For example, an operator or user may insert fingers or a tool into the insertion/removal guide grooves 41 to detach or insert the loading targets 10 from or into the storage compartments 30. Thus, the insertion/removal guide grooves 41 can facilitate the attachment and detachment of the loading targets 10 from the storage compartments 30.

The guides 50 may face the second long side surfaces 14$a$_2 of the loading targets 10. If the loading targets 10 are display devices 10 including chip-on-films (COFs) 110 and bendably flexible printed circuit boards (FPCBs) 111, as will be described with reference to FIG. 21, the guides 50 may support the second long side surfaces 14$a$_2 of the loading targets 10, which are opposite to the first long side surfaces 14$a$_1 of the loading targets 10.

The guides 50 may be formed to protrude toward the loading targets 10 within the storage compartments 30, guiding the insertion of the loading targets 10 and supporting the loading targets 10 once inserted. As illustrated in FIG. 2, multiple guides 50 may be provided only on the sides of the tray sidewall parts 40 that face the second long side surfaces 14$a$_2 of the loading targets 10, or may be disposed at positions facing the first long side surfaces 14$a$_1, the first short side surfaces 14$b$_1, and/or the second short side surfaces 14$b$_2.

The guides 50 may be spaced apart from the loading targets 10 or may contact and support the side surfaces (or circumferential surfaces) 14 of the loading targets 10.

Referring to FIGS. 5 through 7, the auxiliary buffer members 80 and the corner buffer members 70 may be positioned on the tray sidewall parts 40. The auxiliary buffer members 80 may be coupled to the tray body 20 through auxiliary buffer member coupling parts (e.g., 83 and 84), and corner buffer members 70 may be coupled to the tray body 20 through corner buffer member coupling parts (e.g., 74 and 75).

Referring to FIG. 6, the auxiliary buffer member coupling parts (e.g., 83 and 84) include first lower receiving grooves 83 which are recessed from the tray bottom parts 32 within the storage compartments 30, and lateral support parts 84 which support the buffer support parts 82 of the auxiliary buffer members 80.

The first lower receiving grooves 83 may accommodate the auxiliary buffer members 80 and may include a T-shaped cross-sectional shape in plan view, but the disclosure is not limited thereto. For example, the first lower receiving grooves 83 may have various other shapes that can accommodate the auxiliary buffer members 80, such as, for example, a rectangular, square, circular, or oval shape.

The first lower receiving grooves 83 may accommodate the bottom surfaces of the auxiliary buffer members 80, and the lateral support parts 84, which may be in the form of receiving grooves positioned on the tray sidewall parts 40, may contact and support the buffer support parts 82 of the auxiliary buffer members 80 and accommodate the auxiliary buffer members 80 therein simultaneously.

Referring to FIG. 7, the corner buffer member coupling parts (e.g., 74 and 75) may include second lower receiving grooves (e.g., 74 and 75) which are recessed from the tray bottom parts 32 within the storage compartments 30.

The second lower receiving grooves (e.g., 74 and 75) may be coupling grooves for the corner buffer members 70 that are recessed in the Z-axis direction (e.g., thickness direction) from a base surface that lies in a same plane as the loading target resting surface 31.

The second lower receiving grooves (e.g., 74 and 75) may accommodate the bottom areas of the corner buffer members 70 and may include horizontal grooves 75 which are aligned in the X-axis direction, and vertical grooves 74 which are aligned in the Y-axis direction perpendicular to the horizontal grooves 75 as coupling parts overlapping the corner buffer members 70. Escape parts 76, which are recessed horizontally, may be formed in the vertical grooves 74 to be connected to the vertical grooves 74.

The escape parts 76 may guide and accommodate second extension parts 71 of the corner buffer members 70 during the deformation of the corner buffer members 70. Specifically, in case that the corner buffer members 70 are bent, at least parts of second areas 71b of the second extension parts 71 may be positioned within the escape parts 76. In case that the corner buffer members 70 are unbent, the escape parts 76 may not accommodate the second areas 71b.

The shape of the second lower receiving grooves (e.g., 74 and 75) is not limited to the shape illustrated in FIG. 7. The second lower receiving grooves (e.g., 74 and 75) may have various shapes that can accommodate the corner buffer members 70 such as a rectangular, square, circular, or oval shape.

As described above, the auxiliary buffer members 80 and the corner buffer members 70 may be positioned on the tray sidewall parts 40 and may protect the loading targets 10 accommodated in the storage compartments 30 from external shocks or forces.

The auxiliary buffer members 80 and the corner buffer members 70 may include a hard plastic resin or may be formed of soft foam. For example, the auxiliary buffer members 80 and the corner buffer members 70 may include at least one selected from among polymethyl methacrylate (PMMA), polyacrylonitrile (PAN), polyacrylic acid (PAA), an ABS resin, nitrile-butadiene rubber (NBR), and polyurethane (PU). The auxiliary buffer members 80 and the corner buffer members 70 may also be formed of polyethylene (PE) or ethylene-vinyl acetate (EVA) foam. However, the disclosure is not limited to these examples.

The heights, in the Z-axis direction, of the auxiliary buffer members 80 and the corner buffer members 70 may be smaller than or equal to the height of the tray sidewall parts 40 in the Z-axis direction. In case that the heights of the auxiliary buffer members 80 and the corner buffer members 70 are smaller than the height of the tray sidewall parts 40, interference with the bottom surfaces of other trays 1 stacked above the auxiliary buffer members 80 and the corner buffer members 70 may be prevented, allowing for a stable stacking of multiple trays 1. The heights of the auxiliary buffer members 80 and the corner buffer members 70 are not particularly limited as long as there is no interference with the bottom surfaces of other trays 1 stacked above the auxiliary buffer members 80 and the corner buffer members 70.

The auxiliary buffer members 80 and the corner buffer members 70 may have a same height. In another embodiment, the auxiliary buffer members 80 and the corner buffer members 70 may have different heights. In case that the auxiliary buffer members 80 and the corner buffer members 70 have a same height, the flatness between multiple trays 1 stacked may be maintained, providing stability in case that the multiple trays 1 are vertically stacked in the Z-axis direction.

Referring to FIGS. 5 and 6, multiple auxiliary buffer members 80 may be spaced apart from each other in the X-direction, which is a horizontal direction, and the auxiliary buffer members 80 may be spaced a distance W1 apart from the loading targets 10 in the Y-direction.

The auxiliary buffer members 80 may absorb impacts applied to the loading targets 10. Specifically, the auxiliary buffer members 80 may prevent shocks from the exterior from being transmitted to the loading targets 10 within the storage compartments 30.

The auxiliary buffer members 80 may include buffer parts 81 and buffer support parts 82, which are accommodated and coupled within the first lower receiving grooves 83. The buffer support parts 82 may be supported while either being spaced apart from or being in contact with the lateral support parts 84.

The auxiliary buffer members 80 may be accommodated in the first lower receiving grooves 83 in the tray body 20. The auxiliary buffer members 80 may be either fitted into the first lower receiving grooves 83 or may be coupled into the first lower receiving grooves 83 via an adhesive.

Referring to FIG. 7, the corner buffer members 70 may buffer impacts at edge areas A (of FIG. 3) of the loading targets 10. As depicted in FIG. 5, the corner buffer members 70 may be positioned at distances W2 and W3 from the loading targets 10. In another example, the corner buffer members 70 may be disposed to contact the loading targets 10.

The corner buffer members 70 may be disposed on inner surfaces (40a and 40b) of the tray sidewall parts 40 disposed adjacent to the edge areas A of the loading target resting surfaces 31 of the tray bottom parts 32.

The corner buffer members 70 may include first extension parts 72, which face, and are supported by, inner surfaces 40*b* of the tray sidewall parts 40 in a second horizontal direction (e.g., the X-axis direction), and second extension parts 71, which face, and are supported by, inner surfaces 40*a* of the tray sidewall parts 40 in a first horizontal direction (e.g., the Y-axis direction) that intersects the second horizontal direction.

The first extension parts 72 and the second extension parts 71 may be either integrally connected or detachable. The first extension parts 72 and the second extension parts 71 may have the same height or different heights.

Bending grooves 77 may be formed between the first extension parts 72 and the second extension parts 71 to assist in deformation of the second extension parts 71 upon impact from the fall of the loading targets 10.

The bending grooves 77 may have a semi-circular shape, but the disclosure is not limited thereto. In another example, the bending grooves 77 may have various other shapes such as a semi-oval, triangular, or rectangular shape, or another polygonal shape. The bending grooves 77 may serve as damping grooves to gradually attenuate impacts.

Referring to FIG. 8, the second extension parts 71 of the corner buffer members 70 may include first areas 71*a*, which are supported by the inner surfaces 40*a* of the tray sidewall parts 40, and second areas 71*b*, which extend from the first areas 71*a* in the Y-axis direction and retreat into the escape parts 76 without contacting the inner surfaces 40*a* of the tray sidewall parts 40 during bending. The first areas 71*a* and the second areas 71*b* may be positioned to be connected along the Y-axis direction, which is the first horizontal direction.

In case that external forces are generated on the loading targets 10, the corner buffer members 70 may deform and contract, extending a buffering duration and thereby reducing the magnitude of impacts. Consequently, the corner buffer members 70 may reduce the impacts (or external forces) applied to the loading targets 10 within the tray body 20.

The corner buffer members 70 may be accommodated in the second lower receiving grooves (e.g., 74 and 75), with the first extension parts 72 and the second extension parts 71 coupled into the horizontal grooves 75 and the vertical grooves 74, respectively.

In case that external forces are generated on the loading targets 10, such as in case that the corner buffer members 70 are pushed by the loading targets 10 while being in contact with the loading targets 10, the corner buffer members 70 may be compressed and bent. Consequently, the second extension parts 71 may be guided to retreat into the escape parts 76 connected to the vertical grooves 74. Through this compression and bending, the corner buffer members 70 can absorb and buffer the external forces applied to the loading targets 10 through compression and bending deformation. As the corner buffer members 70 are positioned in the edge areas A and the second extension parts 71 retreat into the escape parts 76 during bending, the second extension parts 71 can absorb the external forces. Therefore, the loading targets 10 may be prevented from being damaged by direct or indirect contact with the tray 1, and the impacts (or external forces) applied to the loading targets 10 may be dissipated.

As the second extension parts 71 retreat into the escape parts 76, e.g., as the corner buffer members 70 are deformed and compressed, the corner buffer members 70 can absorb and buffer the impacts (or external forces) applied to the edge areas A of the loading targets 10.

The corner buffer members 70 may be fixed in the second lower receiving grooves (e.g., 74 and 75) with an adhesive, may be fitted to the second lower receiving grooves (e.g., 74 and 75), or may be coupled to the second lower receiving grooves (e.g., 74 and 75) using other coupling methods or means, but the disclosure is not limited thereto.

The buffering process of buffer members upon the occurrence of external forces on the loading targets 10 accommodated within the tray 1 will hereinafter be described with reference to FIGS. 8 through 15.

Figure 9:
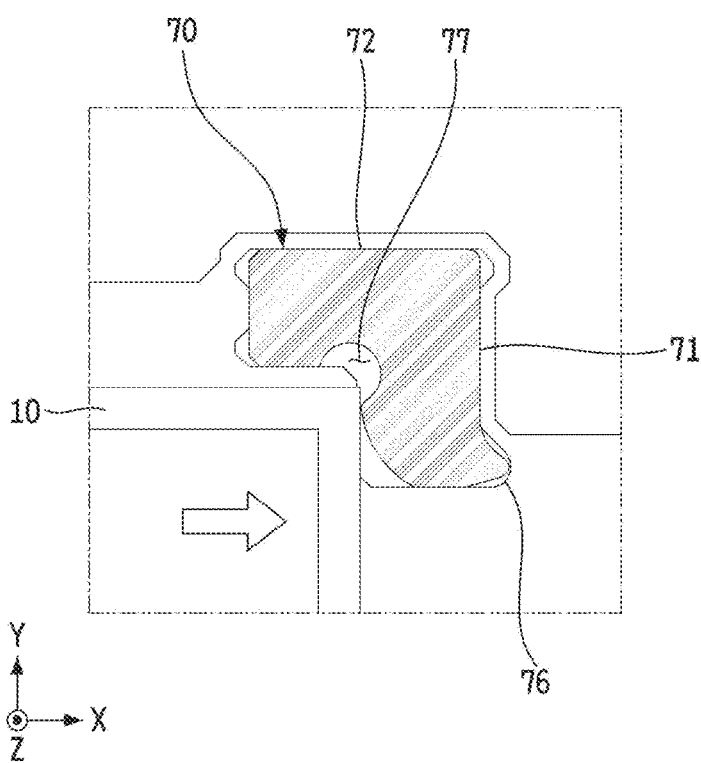
FIG. 9 is an enlarged schematic top view illustrating the state where the corner buffer member of FIG. 8 is compressed by a loading target for buffering.
Figure 10:
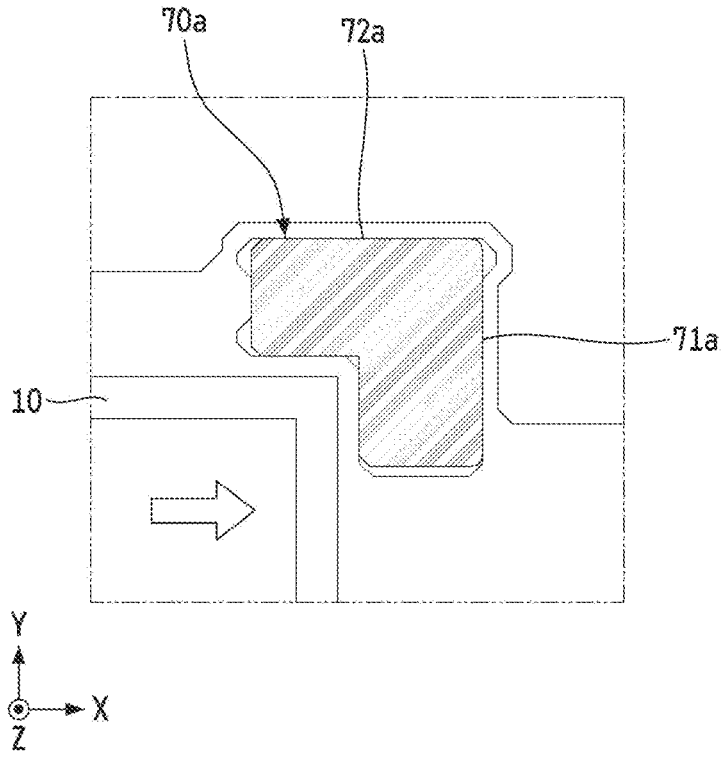
FIG. 10 is an enlarged schematic top view of a buffer member without bending grooves and escape parts, before an external force impacts a loading target.
Figure 11:
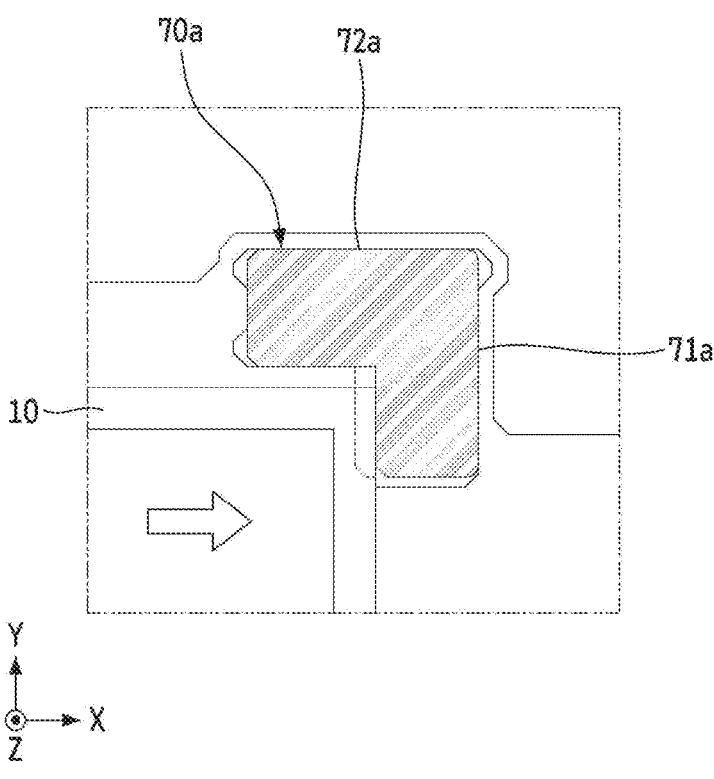
FIG. 11 is an enlarged schematic top view illustrating the state where the buffer member of FIG. 10 is compressed by a loading target.
Figure 12:
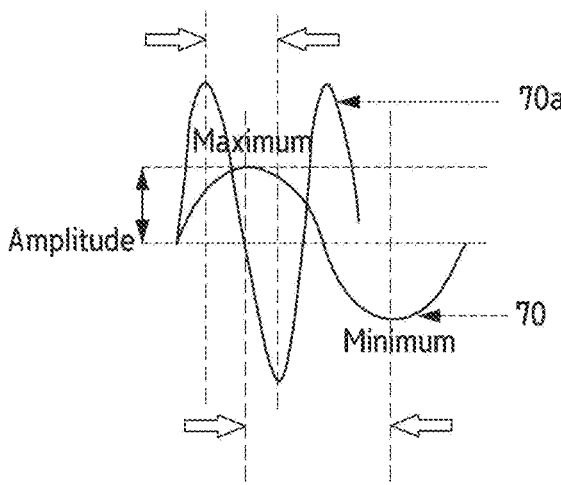
FIG. 12 is a graph schematically showing the buffering actions of the buffer members of FIGS. 8 and 10.

FIG. 8 is an enlarged schematic top view of the area where the corner buffer member of FIG. 7 is installed before an external force impacts a loading target, FIG. 9 is an enlarged schematic top view illustrating the state where the corner buffer member of FIG. 8 is compressed by a loading target for buffering, FIG. 10 is an enlarged schematic top view of a buffer member without bending grooves and escape parts, before an external force impacts a loading target, FIG. 11 is an enlarged schematic top view illustrating the state where the buffer member of FIG. 10 is compressed by a loading target, and FIG. 12 is a schematic graph showing the buffering actions of the buffer members of FIGS. 8 and 10.

Referring to FIG. 8, before any impact (or external force) such as shock is applied, the loading target 10 is positioned at a distance from the corner buffer member 70. Then, referring to FIG. 9, in case that an impact (or external force) is generated in a direction from the edge area of the loading target 10 toward the corner buffer member 70, the loading target 10 may move toward the corner buffer member 70 and may come into contact with and be pressed against the corner buffer member 70. Consequently, as illustrated in FIG. 9, the corner buffer member 70 may be compressed and bent, eventually retreating into the escape part 76. This compression and bending of the corner buffer member 70 effectively mitigate the impact.

In contrast, referring to FIGS. 10 and 11, which illustrate a buffer member 70*a* without bending grooves or escape parts, in case that subjected to an impact in the direction indicated by an arrow, the loading target 10 may move in X-axis direction. The buffer member 70*a*, positioned at the edge area of the loading target 10, becomes excessively compressed, leaving no space for retreat as illustrated in FIG. 11. This excessive compression may significantly deform the buffer member 70*a*, pushing it close to the inner surface 40*a* of the tray sidewall part 40, potentially causing damage to the edge area of the loading target 10. This is critical in case that a display device with a COF 110 (shown in FIG. 21) and an FPCB 111 (shown in FIG. 21) is accommodated as the loading target 10, as the edge area of the display device may suffer damage, leading to defects.

Referring to FIG. 12, the buffer member 70*a* without bending grooves and escape parts shows a short duration of collision, resulting in a high peak in impact force. Conversely, the corner buffer member 70 with an escape part 76, deformable and bendable upon impact, extends the duration of collision, thereby resulting in lowering the impact force. Therefore, the corner buffer member 70 can protect the edge area A of the loading target 10 from an impact (or external force). For example, in case that an impact (or external force) is applied to the edge area of the loading target 10, the deformation of the corner buffer member 70 extends the duration of collision, prevents stress concentration at the edge area A of the loading target 10 within the corner buffer member 70, and reduces the impact force, thus preventing and protecting the edge area A of the loading target 10 from damage.

Figure 13:
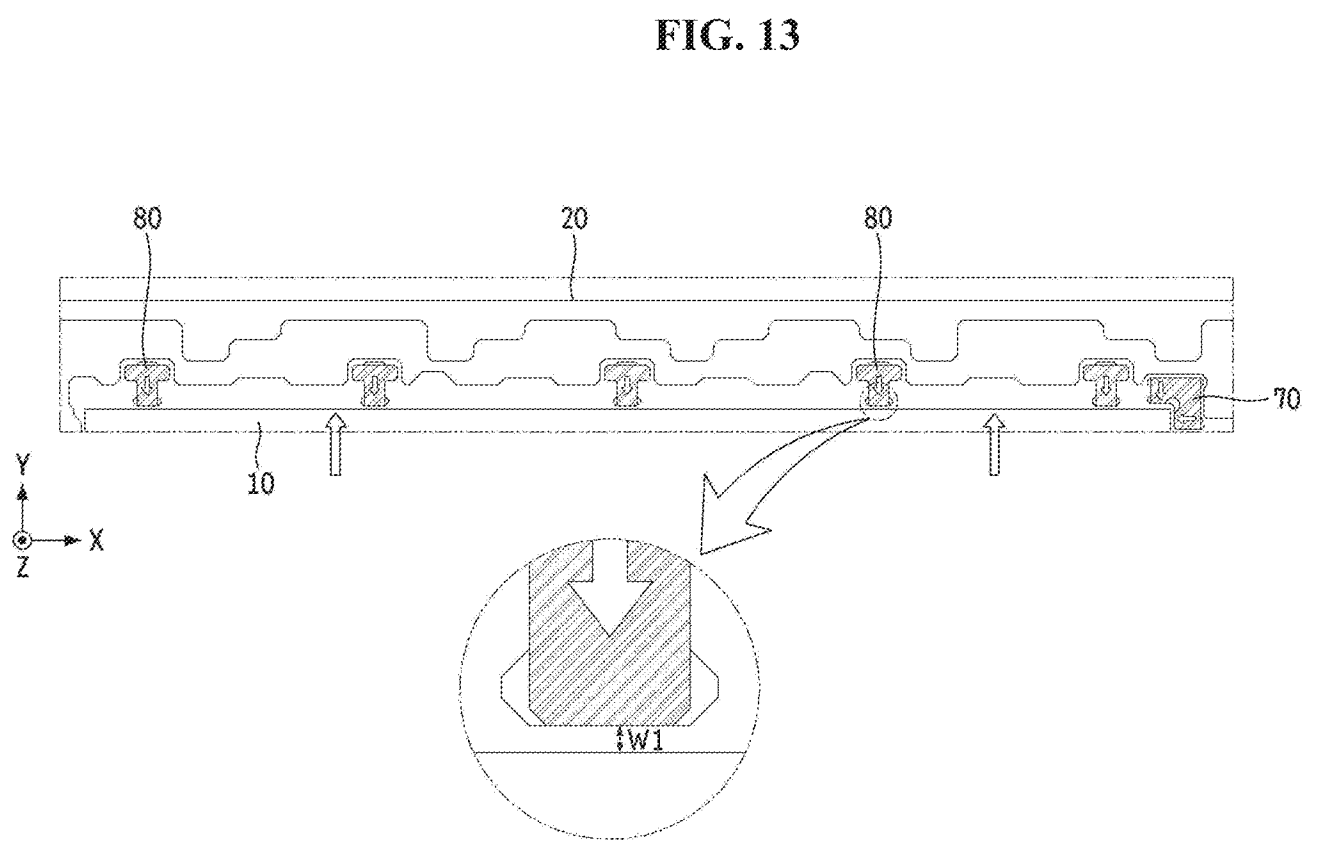
Figure 14:
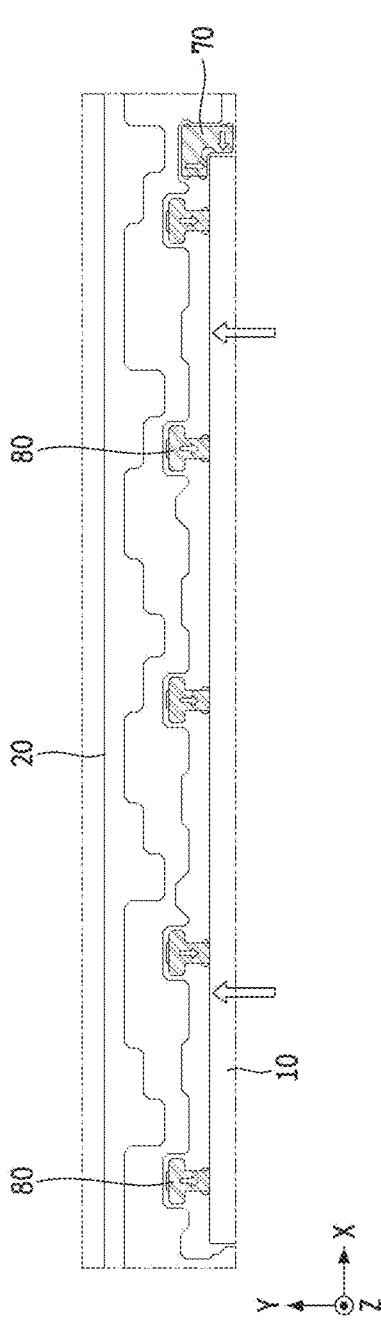
FIG. 14 is a schematic top view illustrating the state where the auxiliary buffer members of FIG. 13 contact the loading target upon the occurrence of an external force on a loading target.
Figure 15:
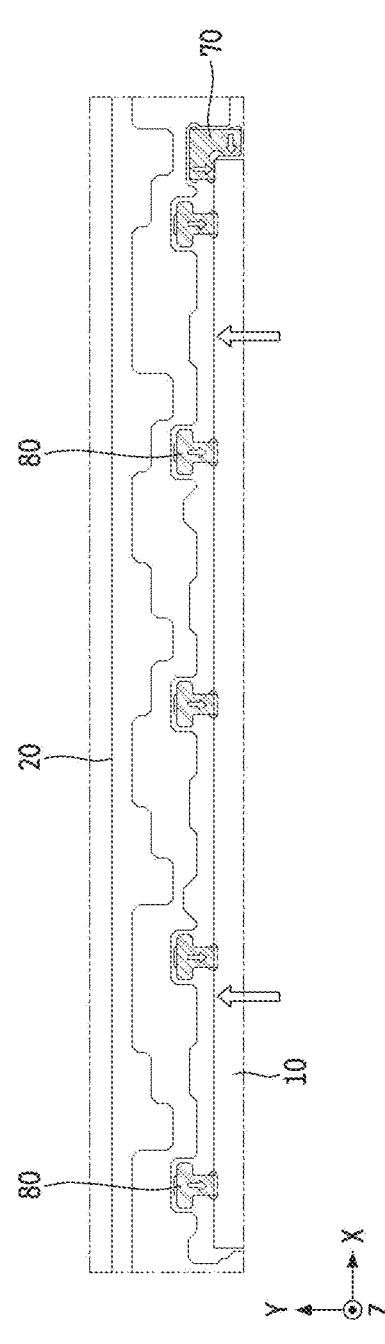
FIG. 15 is a schematic top view illustrating the state where the auxiliary buffer members of FIG. 13 are compressed by a loading target for buffering.

FIG. 13 presents an enlarged schematic top view of the area where the auxiliary buffer members of FIG. 5 are installed, before the occurrence of an external force on a loading target, FIG. 14 is a schematic top view illustrating the state where the auxiliary buffer members contact the loading target upon the occurrence of an external force on the loading target, and FIG. 15 is a schematic top view illustrating the state where the auxiliary buffer members are compressed by the loading target for buffering.

Referring to FIGS. 13 through 15, in case that an impact (or external force) is generated on the loading target 10 in the direction indicated by arrows in FIG. 13, maintaining a gap W1 between the auxiliary buffer members 80 and the loading target 10, for example, in case that the loading target is pushed in Y-axis direction, the loading target 10 may come into contact with the auxiliary buffer members 80, as illustrated in FIG. 14. As depicted in FIG. 15, the auxiliary buffer members 80, pressed by the loading target 10, may be deformed and absorb the impact (or external force) applied in the direction of the arrows, thereby preventing damage to the loading target 10 from the impact (or external force).

In case that an impact (or external force) is generated on the loading target 10 accommodated within the tray 1, for example, due to a fall or movement of the tray 1 causing internal motion of the loading target 10, the impact (or external force) applied in the direction of the arrows may be buffered by the deformation and absorption of the auxiliary buffer members 80 arranged along the X-axis direction. In case that an impact (or external force) is generated in the edge area A of the loading target 10 in the direction of the arrows, the second extension part 71 of the corner buffer member 70 positioned in the edge area A may retreat into the escape part 65, thus protecting the edge area A of the loading target 10.

Corner buffer members 70 according to other embodiments will hereinafter be described with reference to FIGS. 16 through 25.

Figure 16:
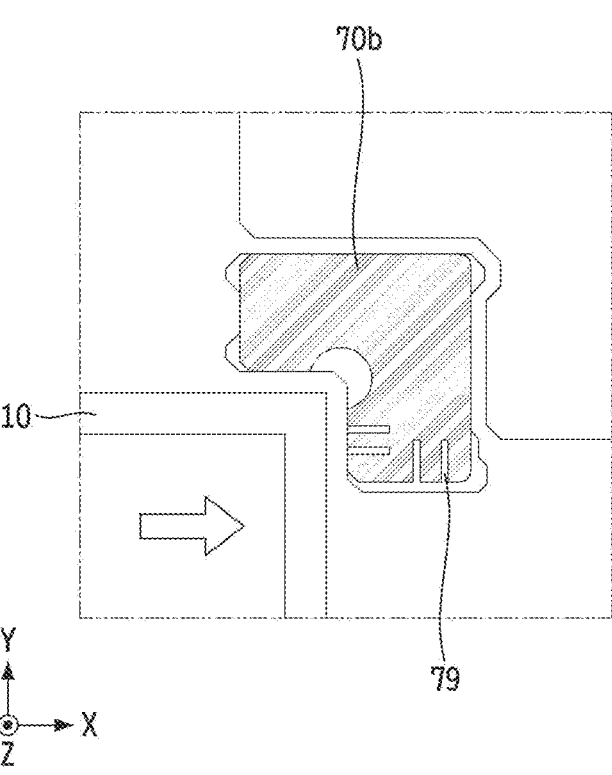
FIGS. 16 through 25 are schematic top views illustrating auxiliary buffer members and corner buffer members according to various embodiments.

FIG. 16 is an enlarged schematic top view of a corner buffer member according to another embodiment.

Referring to FIG. 16, a corner buffer member 70b differs from the corner buffer member 70 of FIG. 8. For example, the corner buffer member 70b may include multiple bending slits 79. Due to the bending slits 79, the bending force of the corner buffer member 70b may be enhanced by allowing the corner buffer member 70b to retreat into an escape part 76.

Figure 17:
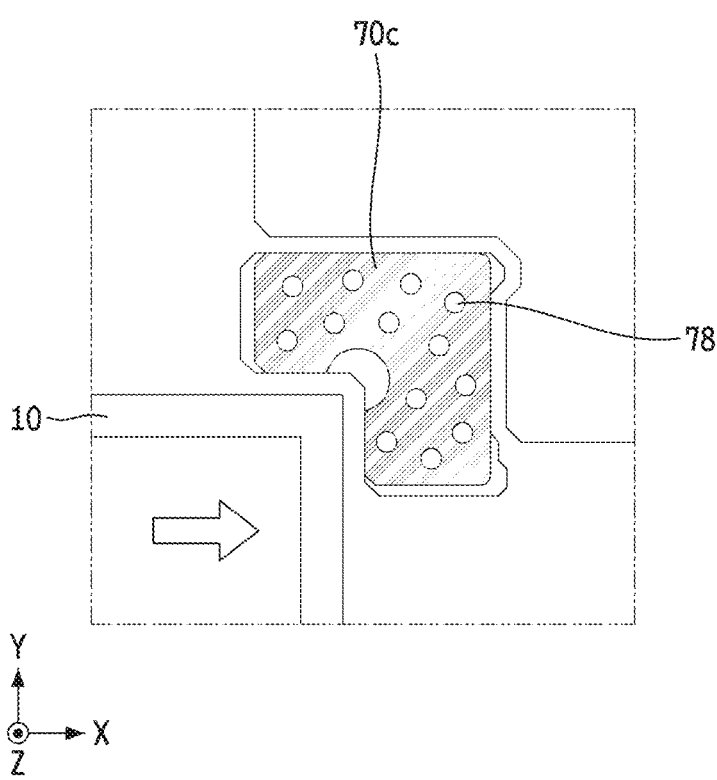

FIG. 17 is an enlarged schematic top view of a corner buffer member according to another embodiment.

Referring to FIG. 17, a corner buffer member 70c differs from the corner buffer member 70 of FIG. 8. For example, the corner buffer member 70c may include multiple perforations 78. The corner buffer member 70c is the same as the corner buffer member 70 of FIG. 8 except for the presence of the perforations. Due to the perforations, the deformation of the corner buffer member 70c upon the occurrence of an impact (or external force) may be facilitated, and the bending force of the corner buffer member 70c, guided into an escape part 76 may be enhanced.

Figure 18:
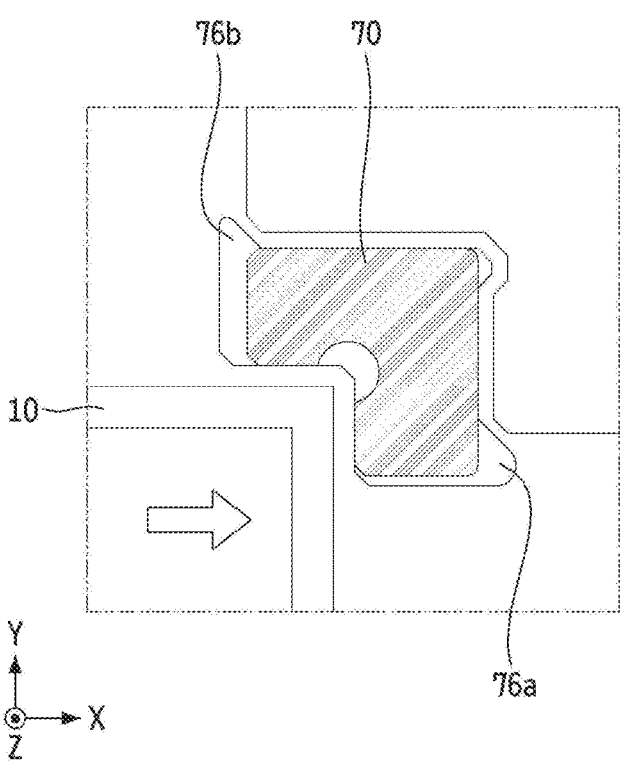

FIG. 18 is an enlarged schematic top view of a corner buffer member according to another embodiment.

Referring to FIG. 18, a corner buffer member 70 differs from its counterpart of FIG. 8. For example, the corner buffer member 70 may include multiple escape parts 76a and 76b. In case that an impact (or external force) is generated on a loading target 10, pushing the loading target 10 in the direction indicated by an arrow in FIG. 18, the corner buffer member 70 may be compressed and deformed to retreat into the two escape parts 76a and 76b. Thus, the corner buffer member 70 may be deformed or bent. Consequently, the duration of collision may be extended, and the impact force may be further reduced.

Figure 19:
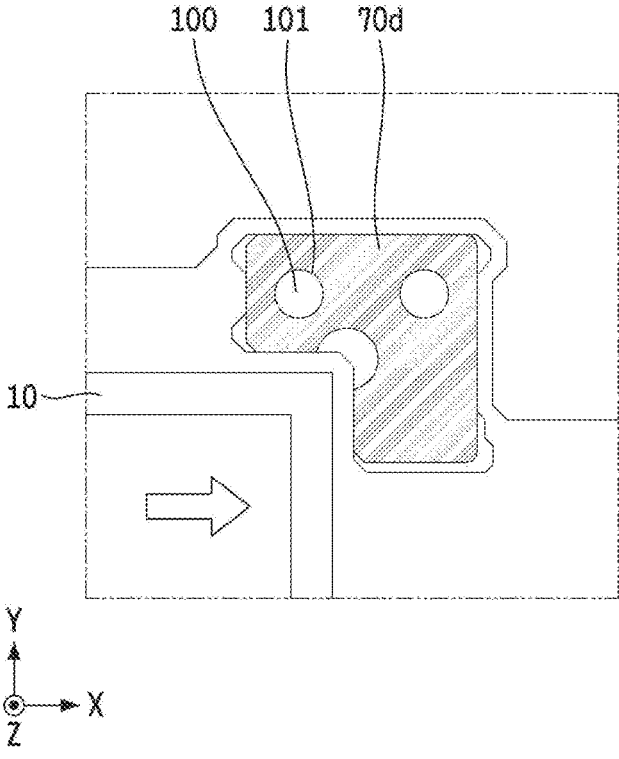

FIG. 19 is an enlarged schematic top view of a corner buffer member according to another embodiment.

Referring to FIG. 19, a corner buffer member 70d differs from its counterpart of FIG. 8. For example, the corner buffer member 70d may multiple coupling protrusions 100. The corner buffer member 70d may be fixed with an adhesive tape as illustrated in FIG. 8. In another example, as illustrated in FIG. 19, the corner buffer member 70d may also include protrusion insertion holes 101 and may be coupled by inserting the coupling protrusions 100 which protrude from second lower receiving grooves (e.g., 74 and 75) in the protrusion insertion holes 101. For example, a robust coupling force may be provided, and thus, displacement of the corner buffer member 70d during movement of a loading target 10 may be prevented.

Figure 20:
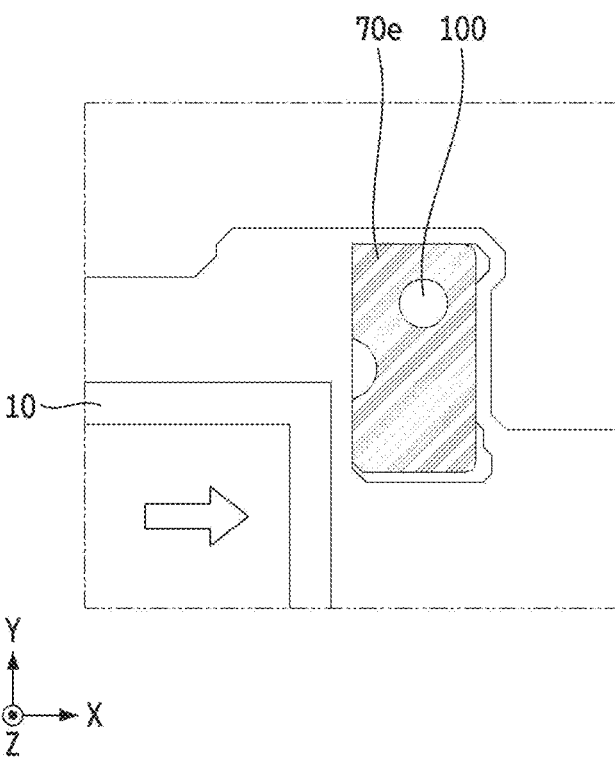

FIG. 20 is an enlarged schematic top view of a corner buffer member according to another embodiment.

Referring to FIG. 20, a corner buffer member 70e is a same as the corner buffer member 70d of FIG. 19 except that the corner buffer member 70e may include the second extension part 71 extending along a Y-axis direction, whereas the corner buffer member 70d of FIG. 19 includes the second extension part 71 extending along both an X-axis direction and the Y-axis direction. The corner buffer member 70e may protect an edge area A of a loading target 10 in case that an impact (or external force) is generated in the direction indicated by an arrow, and may contribute to reducing manufacturing costs.

Figure 21:
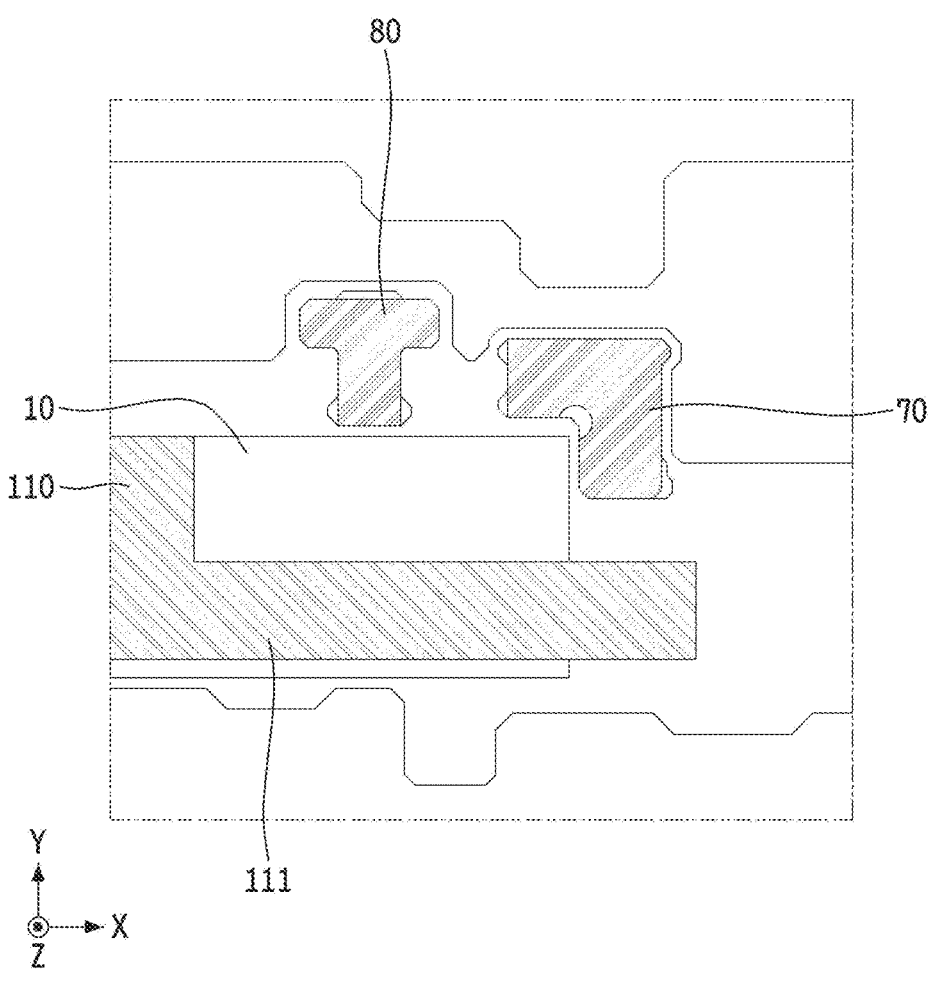

FIG. 21 is an enlarged schematic top view of a loading target according to another embodiment.

Referring to FIG. 21, in a case where a display device including a COF 110, which is a driving film and an FPCB 111, which is a circuit member connected to the COF 110 and is bent, is provided as a loading target 10 and the FPCB 111 is disposed to protrude in an X-axis direction, an edge area A of the loading target 10 may be spaced apart from a corner buffer member 70. Thus, the loading target 10 may be prevented from contacting the corner buffer member 70, and as a result, damage to or defects in the FPCB 111 that may be caused by the corner buffer member 70 may be prevented.

Figure 22:
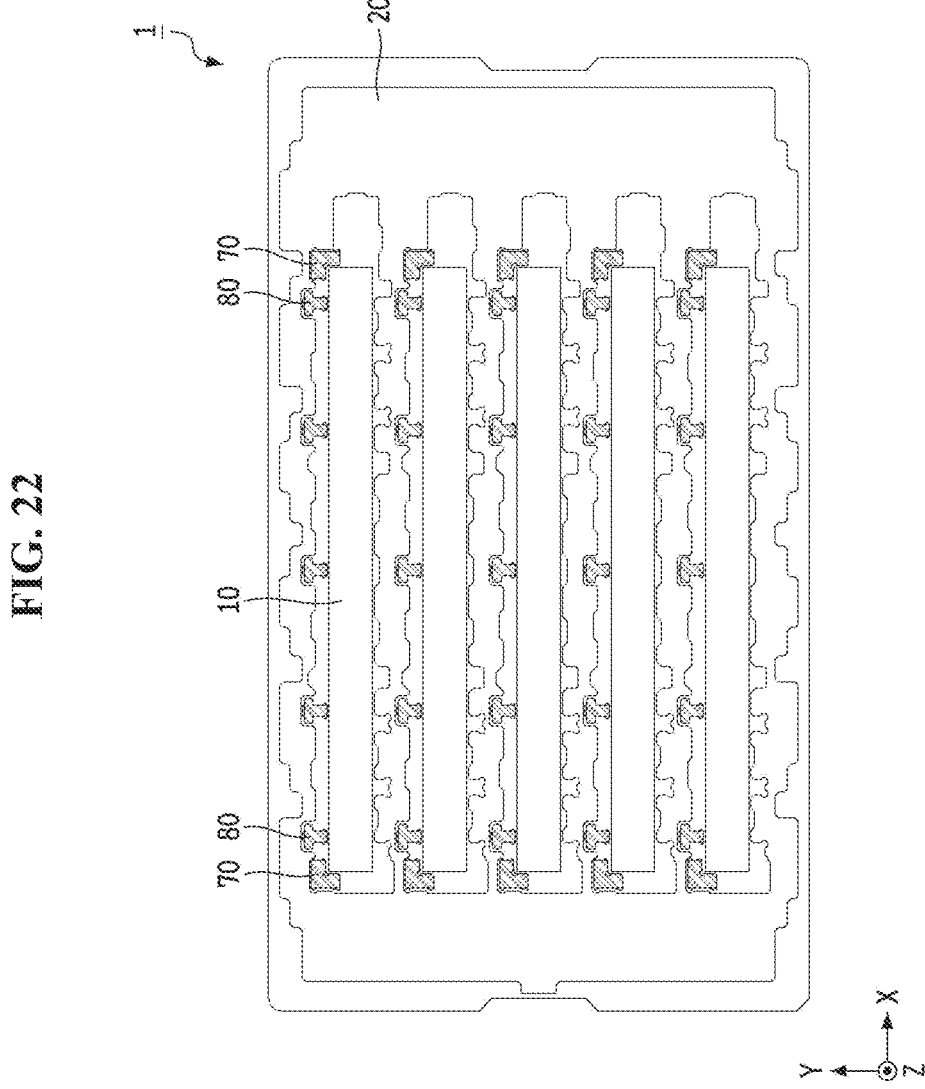

FIG. 22 is a schematic top view of a tray with corner buffer members according to another embodiment.

The embodiment of FIG. 22 differs from the embodiment of FIG. 2 in that corner buffer members 70 are positioned at both edge areas of each loading target 10 along a Y-axis direction. For example, the corner buffer members 70 may be disposed at two corners of each of the load targets 10. Referring to FIG. 22, a pair of corner buffer members 70 may be positioned in either edge area, in the Y-axis direction, of each loading target 10.

Figure 23:
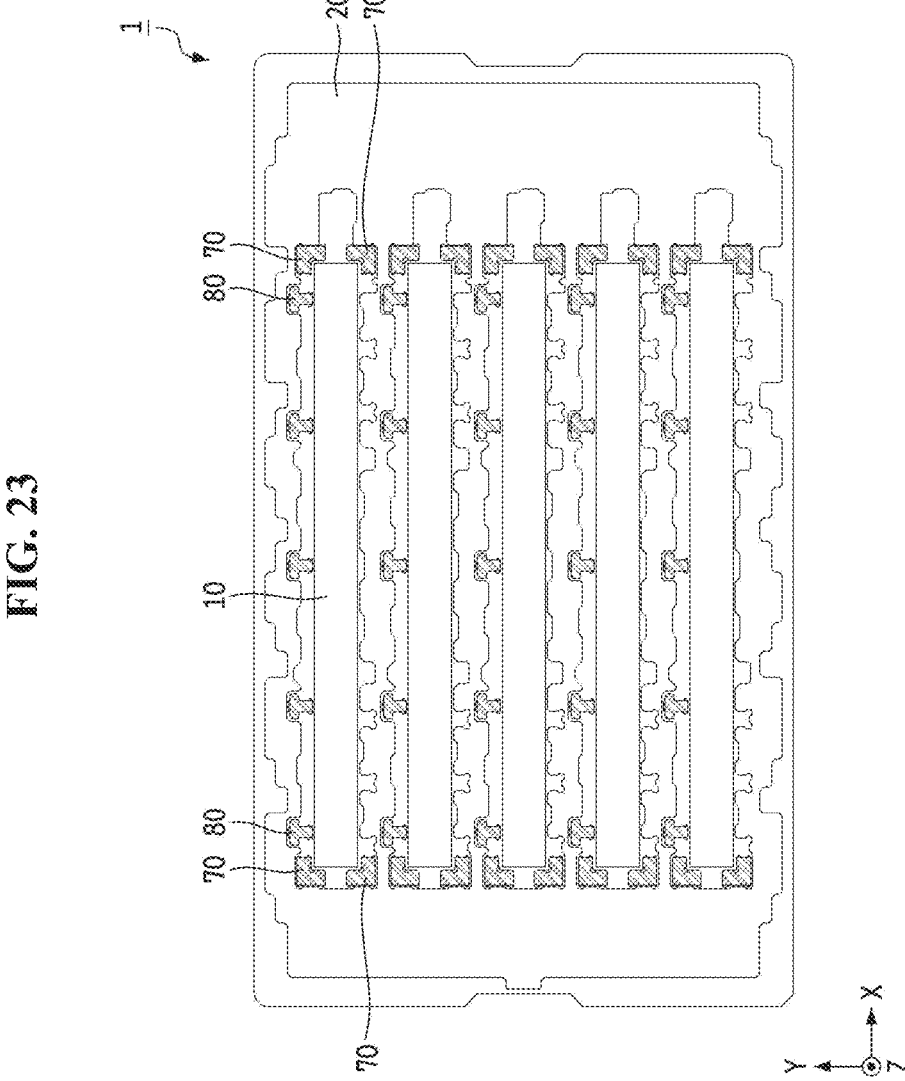

FIG. 23 is a schematic top view of a tray with a corner buffer member according to another embodiment.

The embodiment of FIG. 23 is a same as the embodiment of FIG. 22 except that corner buffer members 70 may be positioned at four corners along the circumferential direction of each loading target 10. Therefore, shocks occurring in both X-axis and Y-axis directions may be buffers.

Figure 24:
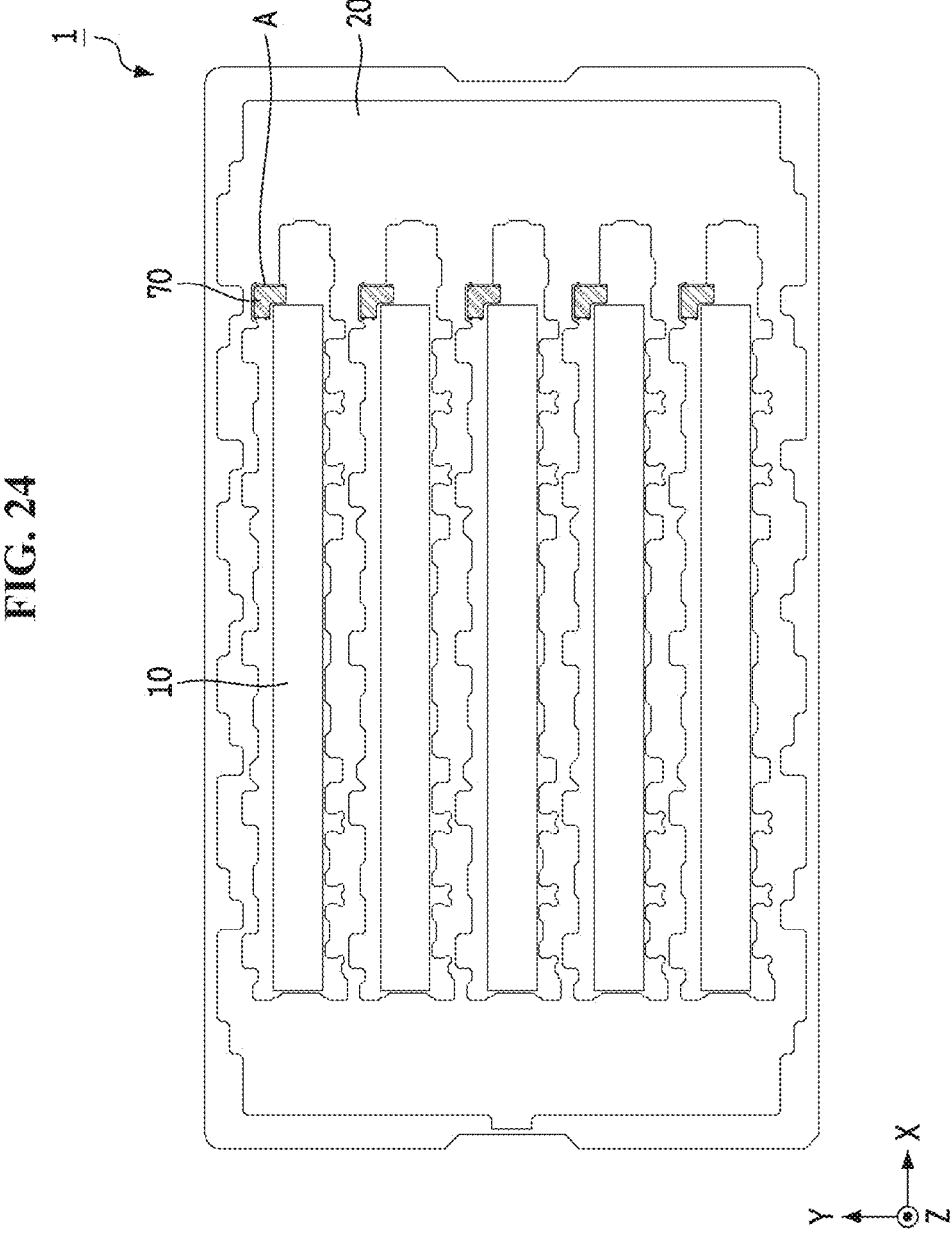

FIG. 24 is a schematic top view of a tray according to another embodiment.

The embodiment of FIG. 24 is a same as the embodiment of FIG. 3 except that auxiliary buffer members 80 are not provided. Referring to FIG. 24, corner buffer members 70 may be positioned at edge areas A of each loading target 10, which are vulnerable to shocks, with each loading target 10 fitted and accommodated in a storage compartment 30 without any gap. Thus, the corner buffer members 70 can mitigate impacts at the edge areas A that are highly vulnerable to external shocks, through compression and deformation.

Figure 25:
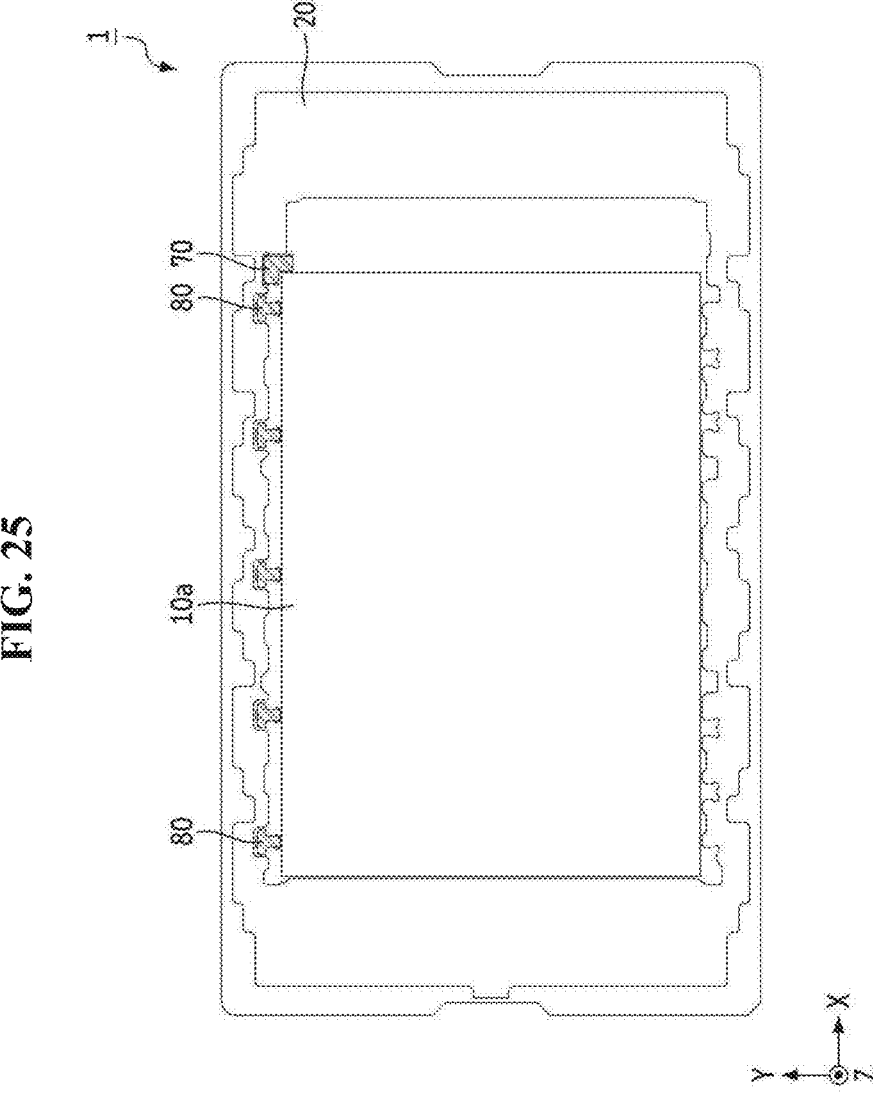

FIG. 25 is a schematic top view of a tray with a loading target accommodated therein according to another embodiment.

The embodiment of FIG. 25 differs from the embodiment of FIG. 3 in that one loading target 10*a* is accommodated in one tray 1. In the embodiment in FIG. 3, five storage compartments 30 may be provided in one tray 1 and may accommodate five loading targets 10. However, referring to FIG. 25, a large-size display device, as a loading target 10*a*, may be accommodated within a single storage compartment 30. Accordingly, various sizes of display devices may be accommodated depending on the size of each loading target.

Accordingly, corner buffer members may be compressed and bent during a fall or collision, thereby extending the duration of collision with the loading targets and reducing the impact force. Consequently, damage to the loading targets may be prevented.

However, the effects of the disclosure are not restricted to the one set forth herein. The above and other effects of the disclosure will become more apparent to one of daily skill in the art to which the disclosure pertains by referencing the claims. The above description is an example of technical features of the disclosure, and those skilled in the art to which the disclosure pertains will be able to make various modifications and variations. Thus, the embodiments of the disclosure described above may be implemented separately or in combination with each other.

The embodiments disclosed in the disclosure are intended not to limit the technical spirit of the disclosure but to describe the technical spirit of the disclosure, and the scope of the technical spirit of the disclosure is not limited by these embodiments. The protection scope of the disclosure should be interpreted by the following claims, and it should be interpreted that all technical spirits within the equivalent scope are included in the scope of the disclosure.

What is claimed is:

1. A tray comprising:
a tray bottom part comprising a loading target resting surface that comprises at least one corner portion in plan view;
a sidewall part protruding from the tray bottom part in a thickness direction and surrounding the loading target resting surface at least partially; and
a corner buffer member adjacent to the at least one corner portion of the loading target resting surface,
wherein the corner buffer member comprises:
a first area adjacent to the sidewall part in a second horizontal direction, the first area comprising a first outer lateral surface opposite to the loading target resting surface and extending along the sidewall part in a first horizontal direction perpendicular to the second horizontal direction, and
a second area which extends from the first area in the first horizontal direction and is not adjacent to supported by the sidewall part in the second horizontal direction, the second area comprising a second outer lateral surface opposite to the loading target resting surface and extending beyond the sidewall part in the first horizontal direction,
wherein, in an unbent state of the corner buffer member, the first outer lateral surface and the second outer lateral surface of the corner buffer member are coplanar and do not overlap the sidewall part in the first horizontal direction, and wherein, in a bent state of the corner buffer member, the first outer lateral surface and the second outer lateral surface of the corner buffer member are not coplanar, and the second outer lateral surface of the corner buffer member overlaps the sidewall part in the first horizontal direction.

2. The tray of claim 1, wherein
the first area is surrounded by a first inner surface of the sidewall part extending in the second horizontal direction and a second inner surface of the sidewall part extending in the first horizontal direction, and
the second area extends from the first area to an end portion in the first horizontal direction.

3. The tray of claim 1, wherein
the sidewall part extends in the first horizontal direction along the first outer lateral surface of the first area, and
the second area of the corner buffer member is spaced apart from a portion of the sidewall part that extends in the first horizontal direction.

4. The tray of claim 1, wherein the tray bottom part comprises:
a base surface, wherein the base surface and the loading target resting surface are in a same plane, and
a coupling groove which is recessed from the base surface in the thickness direction, and
wherein, the corner buffer member is inserted in the coupling groove.

5. The tray of claim 4, wherein the coupling groove comprises:
a coupling part overlapping the corner buffer member in the thickness direction, and
an escape part which is recessed toward the first horizontal direction from the coupling part to be adjacent to the sidewall part in the first horizontal direction.

6. The tray of claim 5, wherein, in the unbent state of the corner buffer member, the escape part does not overlap the corner buffer member.

7. The tray of claim 5, wherein, in the bent state of the corner buffer member, at least part of the second area of the corner buffer member is inserted in the escape part and contacts the escape part.

8. The tray of claim 1, wherein the corner buffer member comprises:
a first extension part extending in the second horizontal direction, and
a second extension part extending in the first horizontal direction.

9. The tray of claim 8, wherein the second area is provided on the second extension part.

10. The tray of claim 8, wherein the corner buffer member further comprises a bending groove which is recessed on an inside of an intersection between the first and second extension parts.

11. The tray of claim 10, wherein the bending groove faces the at least one corner portion of the loading target resting surface.

12. The tray of claim 3, further comprising:
a storage compartment formed by the tray bottom part and the sidewall part and accommodating a loading target to overlap the loading target resting surface,
wherein the corner buffer member is positioned at an edge area of the loading target accommodated in the storage compartment.

13. The tray of claim 5, wherein
the coupling part further comprises a coupling protrusion which protrudes in the thickness direction, and the corner buffer member further comprises a protrusion insertion hole into which the coupling protrusion is inserted.

14. The tray of claim 1, wherein the corner buffer member further comprises at least one bending slit which is formed as a cut line extending either in the first horizontal direction or in the second horizontal direction.

15. The tray of claim 1, wherein the corner buffer member further comprises a plurality of perforations.

16. The tray of claim 12, wherein the loading target has a rectangular shape comprising a pair of long sides extending in the second horizontal direction and a pair of short sides extending in the first horizontal direction, and the tray further comprises an auxiliary buffer member positioned in the sidewall part and facing at least one of the pair of long sides.

17. The tray of claim 16, wherein the loading target further comprises a circuit member which is provided on at least one of the pair of long sides, and the auxiliary buffer member faces the circuit member and is arranged in the second horizontal direction.

18. The tray of claim 17, wherein the circuit member comprises a protruding area, a part of which is positioned to protrude outward from the loading target in the second horizontal direction, and the corner buffer member faces the protruding area of the circuit member at a location apart from the protruding area of the circuit member in the first horizontal direction.

19. The tray of claim 16, wherein the auxiliary buffer member comprises a buffer part which protrudes in the first horizontal direction toward the loading target from the sidewall part to face the loading target, and a buffer support part which is in the second horizontal direction intersecting the buffer part and is fixed to the sidewall part.

20. The tray of claim 19, wherein the sidewall part comprises a receiving groove which is positioned in the second horizontal direction and accommodates the buffer support part.

* * * * *